(12) United States Patent
Namiki et al.

(10) Patent No.: US 7,847,209 B2
(45) Date of Patent: Dec. 7, 2010

(54) METHOD OF FORMING A METAL OXIDE FILM AND MICROWAVE POWER SOURCE DEVICE USED FOR THE ABOVE METHOD

(75) Inventors: Tsunehisa Namiki, Yokohama (JP); Toshihide Ieki, Yokohama (JP); Hideo Kurashima, Yokohama (JP); Hajime Inagaki, Yokohama (JP); Akira Kobayashi, Yokohama (JP); Koji Yamada, Yokohama (JP)

(73) Assignee: Toyo Seikan Kaisha, Ltd., Tokyo (JP)

( * ) Notice: Subject to any disclaimer, the term of this patent is extended or adjusted under 35 U.S.C. 154(b) by 419 days.

(21) Appl. No.: 10/530,357

(22) PCT Filed: Oct. 9, 2003

(86) PCT No.: PCT/JP03/12946

§ 371 (c)(1),
(2), (4) Date: Sep. 23, 2005

(87) PCT Pub. No.: WO2004/033753

PCT Pub. Date: Apr. 22, 2004

(65) Prior Publication Data
US 2006/0138099 A1   Jun. 29, 2006

(30) Foreign Application Priority Data

Oct. 9, 2002   (JP) .............................. 2002-295908
Apr. 16, 2003  (JP) .............................. 2003-112136
Apr. 21, 2003  (JP) .............................. 2003-116301

(51) Int. Cl.
*B23K 9/00*   (2006.01)
*B23K 9/02*   (2006.01)
*B23B 9/04*   (2006.01)

(52) U.S. Cl. ............................ 219/121.47; 219/121.43; 428/446

(58) Field of Classification Search ............ 219/121.47, 219/121.43, 121.36, 121.38, 121.41, 121.44; 156/345.34, 345.41, 345.1; 438/107, 710, 438/708, 728, 484; 118/723 MW, 723 MR, 118/723 ME, 723 E, 723 IR, 723 AN; 427/537, 427/576, 579, 536; 117/104, 105, 106; 205/165
See application file for complete search history.

(56) References Cited

U.S. PATENT DOCUMENTS

| 4,395,313 A | * | 7/1983 | Lindsay et al. .............. 205/165 |
| 4,700,080 A | * | 10/1987 | Fukaya et al. ............... 250/226 |
| 5,616,369 A | * | 4/1997 | Williams et al. ............ 427/536 |
| 5,643,638 A | | 7/1997 | Otto et al. |

(Continued)

FOREIGN PATENT DOCUMENTS

EP   0 718 418 A1   6/1996

(Continued)

*Primary Examiner*—Quang T Van
(74) *Attorney, Agent, or Firm*—Sughrue Mion, PLLC

(57) ABSTRACT

A method of forming a metal oxide film by the plasma CVD method and which includes reacting chiefly an organometal by a glow discharge in a low output region and, then, reacting the organometal with an oxidizing gas by the glow discharge in a high-output region to form a metal oxide film on the surface of a plastic substrate via an organic layer. This method forms a thin film having excellent adhesiveness, softness and flexibility on the surface of a plastic substrate relying on the plasma CVD method.

12 Claims, 19 Drawing Sheets

U.S. PATENT DOCUMENTS

| | | | |
|---|---|---|---|
| 6,159,531 A * | 12/2000 | Dang et al. | 427/2.24 |
| 6,497,783 B1 * | 12/2002 | Suzuki et al. | 156/345.1 |
| 6,818,310 B2 * | 11/2004 | Namiki et al. | 428/446 |
| 2002/0006487 A1 | 1/2002 | O'Connor et al. | |
| 2003/0143821 A1 * | 7/2003 | Niino et al. | 438/484 |

FOREIGN PATENT DOCUMENTS

| | | |
|---|---|---|
| JP | 8-174748 A | 7/1996 |
| JP | 11-348171 A | 12/1999 |
| JP | 2003-328132 A | 11/2003 |
| WO | WO 99/04606 A2 | 1/1999 |

* cited by examiner (a)

(b)

(a)

(b)

METHOD OF FORMING A METAL OXIDE FILM AND MICROWAVE POWER SOURCE DEVICE USED FOR THE ABOVE METHOD

BACKGROUND OF THE INVENTION

1. Field of the Invention

The present invention relates to a method of forming a metal oxide film on the surface of a substrate such as a plastic substrate and a microwave power source device used for the above method.

2. Description of the Related Art

In order to improve properties of various substrates, it has heretofore been attempted to form a metal oxide film on the surfaces of the substrates.

In the field of packaging materials, for example, it has been known to form a metal oxide film on a plastic substrate such as of a container by, for example, a plasma CVD method to improve the gas-barrier property. A method of forming a silicon oxide film (SiOx) has already been known (see, following patent documents).

[Patent Document 1]
Japanese Unexamined Utility Model Publication (Kokai) No. 50563/1974
[Patent Document 2]
Japanese Unexamined Patent Publication (Kokai) No. 58171/1974
[Patent Document 3]
Japanese Unexamined Patent Publication (Kokai) No. 345383/1993
[Patent Document 4]
Japanese Patent No. 2526766

However, the conventional metal oxide films as represented by a silicon oxide film are accompanied by such problems as lack of softness or flexibility and poor adhesion to the substrate. This tendency appears conspicuously particularly when the substrate is made of a plastic material. When the adhesion is poor, the resistance against water is weak and the film easily breaks when it is brought into contact with water making it difficult to accomplish a desired gas-barrier property and, further, deteriorating the productivity.

Besides, when a metal oxide film is formed on the surface of a plastic substrate by the microwave wave plasma CVD, overheating occurs locally and the plastic substrate is deformed.

DESCRIPTION OF THE INVENTION

It is, therefore, an object of the present invention to provide a method of forming a metal oxide film having excellent adhesiveness, softness and flexibility on the surface of a predetermined substrate and, particularly, on the surface of a plastic substrate.

Another object of the present invention is to provide a method of forming a metal oxide film which can be formed on the surface of the plastic substrate by a microwave plasma CVD while effectively suppressing the local overheating and preventing the plastic substrate from being deformed.

A further object of the present invention is to provide a microwave power source device that can be effectively used for the formation of the above metal oxide film.

According to the present invention, there is provided a method of forming a metal oxide film having a gas-barrier property on a surface of a predetermined substrate by reacting an organometal with an oxidizing gas by the plasma CVD method, wherein a reaction between organometals is chiefly carried out by the glow discharge in a low-output region and, then, organometals are reacted with the oxidizing gas by the glow discharge in a high-output region.

In the method of forming a metal oxide film of the present invention, it is important to chiefly react the organometals by the glow discharge of a low output in the initial step prior to reacting the organometal with the oxidizing gas by generating a plasma by the glow discharge of a high output. That is, by forming the film while changing the output of the glow discharge, there is formed an organic layer containing much carbon due chiefly to the reaction of the organometal between a metal oxide layer and the surface of the substrate. The organic layer is rich in flexibility and can be intimately adhered onto the surface of the substrate. By forming a silicon oxide film on the surface of the plastic substrate by using an organosilicon compound as an organometal, therefore, there is formed a richly inorganic layer (containing little carbon) having good gas-barrier property via the above organic layer. Therefore, breakage of the film is effectively prevented, and the gas-barrier property of the plastic substrate is improved.

The glow discharge can be generated by the microwave electric field. Here, it is desired that the microwaves are oscillated intermittently, i.e., it is desired that the microwaves are introduced as pulse waves into the plasma treatment chamber. If the microwaves are continuously oscillated, high-temperature portions occur locally in the plasma treatment chamber, and the substrate is locally overheated and is deformed. By intermittently oscillating the microwaves, however, high-temperature portions are suppressed from locally occurring, and the substrate is effectively prevented from being deformed.

It is further desired that the output waveforms of microwaves that are intermittently oscillated are varied for each of the treatment regions by adjusting the maximum output (peak output) and the oscillation time. In the low-output region of forming the organic layer rich in flexibility, for example, the energy (average output) of microwaves is maintained low, the oscillation time is shortened and a maximum output is increased in order to quicken the ignition of plasma without impairing the formation of the organic layer. In a high-output region of forming a layer which is richly inorganic and having high gas-barrier property, the energy (average output) of microwaves is maintained high, the oscillation time of microwaves is lengthened, and a maximum output is decreased to effectively prevent the deformation of substrate due to overheating.

According to the present invention, further, there is provided a microwave power source device for driving a microwave-generating unit by applying a voltage, comprising:

a voltage-adjusting circuit for determining a peak output in the applied voltage;

an ON time-adjusting circuit for determining an ON time of the applied voltage; and an applied voltage control circuit for forming waveforms of the applied voltage based on said peak output from said voltage-adjusting circuit and/or on said ON time from said ON time-adjusting circuit.

That is, the above microwave power source device is provided not only with the ON time-adjusting circuit for adjusting the ON time of the voltage applied to the microwave-generating unit but also with the voltage-adjusting circuit for adjusting the peak output (maximum voltage) of the applied voltage, making it possible to separately adjust both the ON time and the peak output. Besides, the applied voltage control circuit forms the waveforms of the applied voltage based on both the peak output (preset voltage) adjusted by the voltage-adjusting circuit and the ON time adjusted by the ON time-adjusting circuit. Upon adjusting the peak output and the ON time, therefore, the output of microwaves from the microwave-generating unit to which the voltage is applied can be changed into a desired waveform. By using the above microwave power source device, therefore, a maximum output (peak output) and an oscillation time (ON time) are adjusted to change the output waveform of microwaves into a desired pattern for each of the treatment regions.

According to the present invention, further, there is provided a microwave power source device for driving a microwave-generating unit by applying a voltage, comprising:

a voltage-adjusting circuit for determining a peak output in the applied voltage;

an ON time-adjusting circuit for determining an ON time of the applied voltage based on said peak output in the applied voltage determined by said voltage-adjusting circuit; and an applied voltage control circuit for forming waveforms of the applied voltage based on said ON time from said ON time-adjusting circuit.

According to the above microwave power source device, a peak output in the applied voltage is adjusted by the voltage-adjusting circuit, whereby an ON time corresponding to the adjusted peak output is adjusted and set by the ON time-adjusting circuit, and a waveform of the applied voltage is formed by the applied voltage control circuit based on the ON time. Namely, the applied voltage is formed in a waveform reflecting both the peak output that is adjusted and the ON time, effectively adjusting the output waveform of the microwaves. Accordingly, the applied voltage is effectively utilized for forming a metal oxide film having both intimately adhering property and gas-barrier property.

DETAILED DESCRIPTION OF THE INVENTION

[Substrate]

Figure 1:
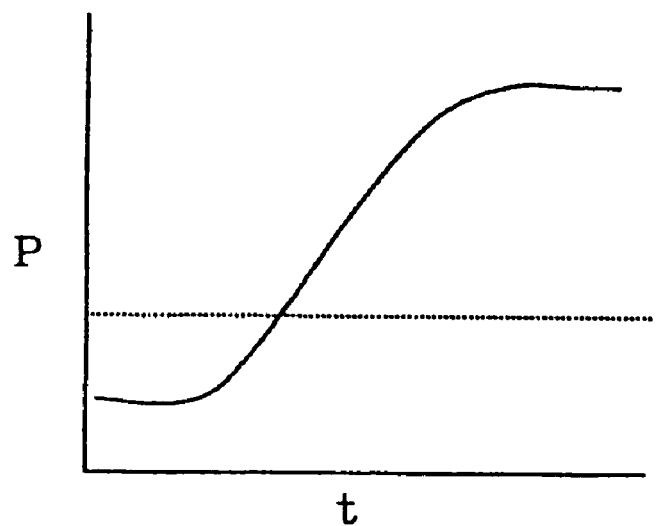
FIGS. 1 to 4 are diagrams illustrating patterns changing from a low glow discharge output to a high glow discharge output.

As the substrate on which a metal oxide film is to be formed according to the present invention, there can be used the one comprising a glass or various metals. Most desirably, however, there can be used a plastic substrate. As the plastic material, there can be used a thermoplastic resin that has been known per se., i.e., polyolefin such as a random or block copolymer of α-olefins, such as low-density polyethylene, high-density polyethylene, polypropylene, poly-1-butene, poly-4-methyl-1-pentene or ethylene, propylene, 1-butene or 4-methyl-1-pentene; ethylene/vinyl compound copolymer such as ethylene/vinyl acetate copolymer, ethylene/vinyl alcohol copolymer or ethylene/vinyl chloride copolymer; styrene resin, such as polystyrene, acrylonitrile/styrene copolymer, ABS or α-methyl styrene/styrene copolymer; thermoplastic polyester, such as nylon 6, nylon 6-6, nylon 6-10, nylon 11, or nylon 12; thermoplastic polyester such as polyethylene terephthalate, polybutylene terephthalate or polyethylene naphthalate; polyphenylene oxide; biodegradable resin such as polylactic acid; or a mixture thereof. The present invention is capable of forming a metal oxide film having particularly excellent adhesiveness and gas-barrier property. Therefore, it is most desired to use a thermoplastic resin that is used as a packaging material. For example, a polyolefin and a thermoplastic polyester are most desired.

The substrate can be used in the form of a film or a sheet, or can be used in the form of a container such as bottle, cup or tube, or in the form of any other molded articles. As the bottle, in particular, there can be exemplified a biaxially oriented blow-molded bottle made of a polyester such as polyethylene terephthalate. The present invention can similarly be applied to the cup of the polyester or to the biaxially oriented film, as a matter of course.

Further, the plastic substrate may be of a gas-barrier multi-layer structure having the thermoplastic resin (preferably, olefinic resin) as an inner layer and as an outer layer, and interposing an oxygen-absorbing layer between the inner layer and the outer layer. Oxygen-barrier properly can be strikingly improved by forming a metal oxide film such silicon oxide film on the surface of the inner layer and/or the outer layer of the multi-layer structure.

[Organometal and Oxidizing Gas]

As the organometal according to the present invention, there can be preferably used an organosilicon compound. However, the organometal is not necessarily limited to the organosilicon compound only provided a metal oxide can be formed upon the reaction with an oxidizing gas. For example, there can be used an organoaluminum compound such as trialkyl aluminum. There can be further used a variety of compounds such as organotitanium compound and the like. As the organosilicon compound, there can be used organosilane compounds, such as hexamethyldisilane, vinyltrimethylsilane, methylsilane, dimethylsilane, trimethylsilane, diethylsilane, propylsilane, phenylsilane, methyltriethoxysilane, vinyltriethoxysilane, vinyltrimethoxysilane, tetramethoxysilane, tetraethoxysilane, phenyltrimethoxysilane, methyltrimethoxysilane, and methyltriethoxysilane; and organosiloxane compounds such as octamethylcyclotetrasiloxane, 1,1,3,3-tetramethyldisiloxane and hexamethyldisiloxane. There can be further used aminosilane and silazane in addition to the above materials.

The above organometals can be used in a single kind or in a combination of two or more kinds. It is further allowable to use the silane ($SiH_4$) and the silicon tetrachloride together with the above organosilicon compound.

Oxygen or NOx is used as the oxidizing gas, and argon or helium is used as the carrier gas.

(Formation of the Metal Oxide Film)

In the present invention, a metal oxide film is formed on the surface of the substrate by the plasma CVD method in an atmosphere containing the above-mentioned organometal, oxidizing gas and carrier gas.

The plasma CVD is to grow a thin film by utilizing a gas plasma, and basically comprises a process of decomposing a gas containing starting gases under a reduced pressure by discharging electric energy in a high electric field, and depositing the formed substance on a substrate in a gaseous phase or through a chemical reaction on the substrate.

The plasma state is realized by the glow discharge. Known systems of the glow discharge include a method that utilizes a DC glow discharge, a method that utilizes a high-frequency glow discharge and a method that utilizes a microwave discharge.

The low-temperature plasma CVD has the following advantages:
(1) The starting gas having a large energy of formation can be easily dissociated since the gaseous molecules are directly decomposed by high-speed electrons;
(2) A low-temperature process can be carried out since the temperature of electrons is different from the temperature of gaseous ions, the temperature of electrons being high having energy necessary for executing the chemical reaction but the temperature of ions being low, establishing a thermally non-equilibrium state; and
(3) A relatively homogeneous amorphous film can be formed despite the substrate temperature is low.

Therefore, the low-temperature plasma CVD can be easily applied to the plastic substrate, too.

In the present invention, the plasma is generated by, first, generating the glow discharge with a low output and, then, with a high output. That is, due to the glow discharge of a low output, the reaction of chiefly the organometal is carried out to form a highly flexible organic layer on the surface of a substrate. Then, due to the glow discharge of a high output, a metal oxide layer is formed on the organic layer by the reaction of the organometal with the oxidizing gas.

If described with reference, for example, to an organosilicon oxide, it is considered that the silicon oxide film is formed through the following reaction path:
(a) Picking up of hydrogen: $SiCH_3 \rightarrow SiCH_2$
(b) Oxidation: $SiCH_2 \rightarrow SiOH$
(c) Condensation: $SiOH \rightarrow SiO$ Namely, the silicon oxide film has so far been formed by executing the glow discharge with a high output. Therefore, the organosilicon compound is reacted at one time up to the step (c). As a result, the silicon oxide film lacks flexibility and poorly adheres to the substrate. According to the present invention, however, the glow discharge is, first, conducted with a low output prior to establishing the glow discharge of a high output. Therefore, the $SiCH_2$ radicals formed in the step (a) react with one another, whereby the polymer of organosilicon compound is formed near the surface of the substrate. As a result, an organic layer rich in carbon component stemming from the polymer is formed on the surface of the substrate. In the subsequent glow discharge of a high output, the reaction (c) chiefly takes place, whereby a silicon oxide layer of a high density is formed to exhibit excellent gas-barrier property.

In the present invention, the glow discharge with the above low output is, usually, conducted in a region of 20 to 90 watts. When the output is lower than the above range, the above-mentioned reaction does not effectively proceed making it difficult to form an organic layer. When the glow discharge is conducted with the output higher than the above region, the reaction proceeds at one time up to the step (c), and it becomes difficult to form an organic layer rich in flexibility.

The glow discharge with the high output is, usually, conducted at not lower than 100 watts.

In the present invention, the above glow discharge is conducted in a high-frequency electric field or in a microwave electric field.

FIGS. 1 to 4 are diagrams illustrating rough patterns changing from a low glow discharge output to a high glow discharge output in the present invention.

Figure 2:
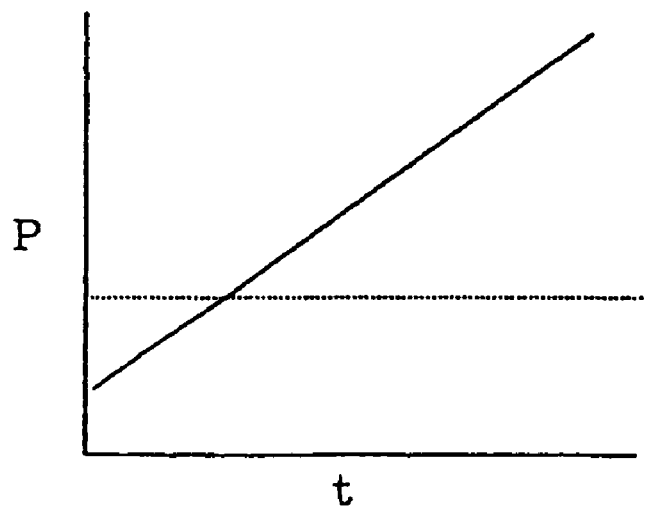
Figure 3:
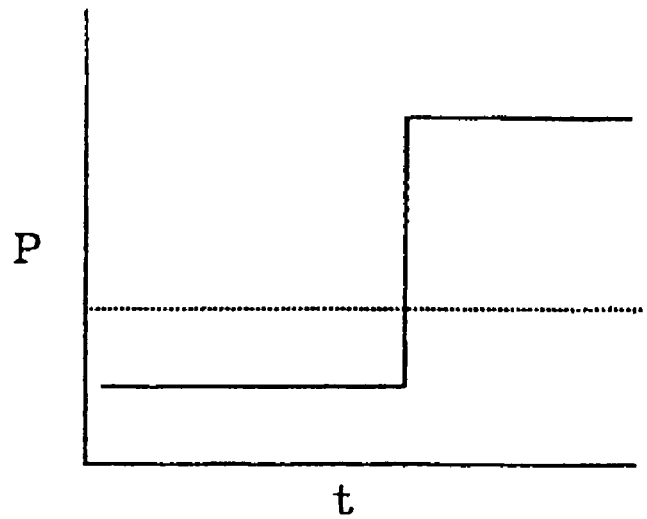

FIGS. 1 and 2 illustrate examples in which the output is continuously changed from a low output to a high output. In this case, an organic layer is formed on the surface of the substrate, and a metal oxide layer is formed thereon. The composition of the metal oxide film, however, changes continuously. FIG. 3 illustrates an example where the output is changed stepwise. In this case, the change from the organic layer to the metal oxide layer is critical.

Figure 4:
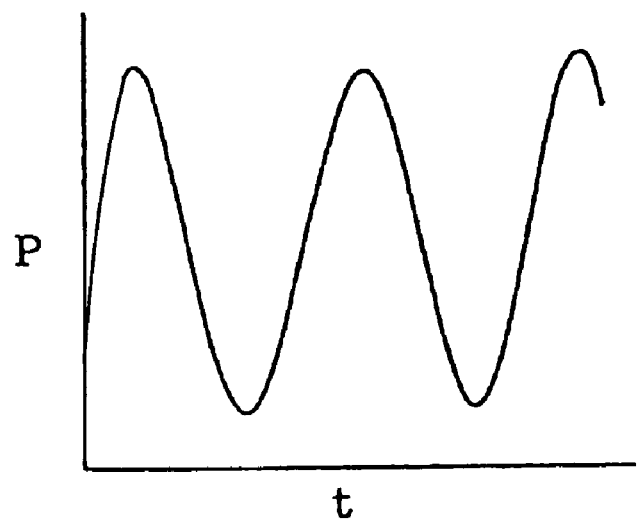

FIG. 4 is an example in which the output is changed from a low output to a high output and, then, the change into the high output and into the low output is repeated. In this case, the organic layer and the metal oxide layer are alternately formed.

In the present invention, in order to maintain good adhesiveness to the substrate, it is desired that the organic layer formed on the surface of the substrate has a carbon concentration of not lower than 15% on the basis of three elements of oxygen, carbon and a metal element (e.g., silicon) and a thickness of not larger than 10 nm. When the carbon concentration is lower than the above value, the adhesiveness to the substrate tends to decrease. When the thickness is greater than the above value, the metal oxide layer formed on the organic layer must have a thickness which is unnecessarily increased to maintain gas-barrier property. As a result, the metal oxide film loses flexibility and the film tends to be broken. In the present invention, therefore, it is most desired to form the metal oxide film with the output pattern shown in FIG. 3. Formation of the organic layer on the surface of the substrate can be confirmed relying, for example, upon the X-ray photoelectron spectroscopic analysis, and the carbon concentration can be calculated by measuring the concentrations of the elements by the X-ray photoelectron spectroscopic analysis.

It is further desired that the total thickness of the metal oxide film inclusive of the thickness of the organic layer is not larger than 100 nm and, particularly, not larger than 50 nm. This is because, if the metal oxide film is too thick, the flexibility is lost and the film tends to be broken as described above.

Figure 5:
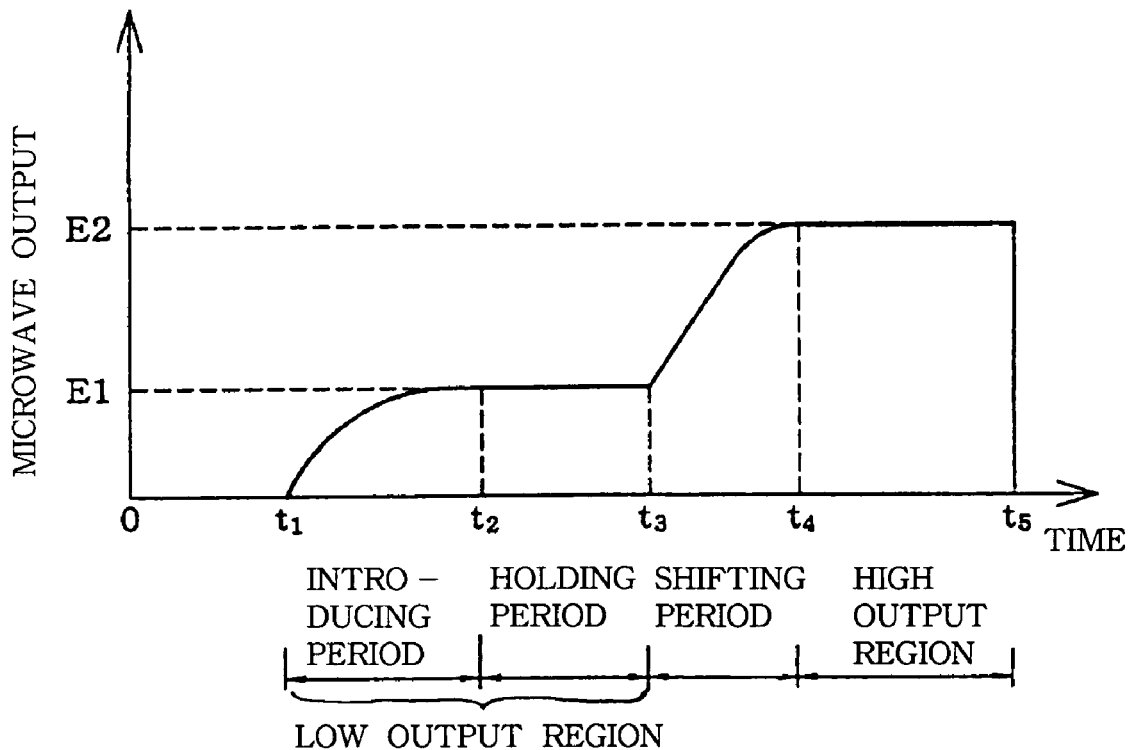
FIG. 5 is a diagram illustrating a change in the output of microwave energy.

In the present invention, it is desired that the plasma reaction is conducted by the glow discharge in the microwave electric field; i.e., the plasma reaction is conducted by introducing microwaves into a plasma treatment chamber containing a substrate that is to be treated. FIG. 5 is a representative example of the output pattern of microwaves employed by the present invention. When the microwaves are introduced (t1) as shown in FIG. 5, plasma light is emitted after a period of introduction, and a film is formed (organic layer is formed) by the plasma CVD due to the microwave output E1 within a predetermined holding time (t2 to t3)(low output region t1 to t3). The microwave output E1 at this moment corresponds to a glow discharge output in the above-mentioned low output region. Then, a film is formed (metal oxide layer is formed) by the plasma CVD in the high output region (t4 to t5) after the shifting period (t3 to t4). The microwave output E2 at this moment corresponds to the glow discharge output in the above-mentioned low output region. It is further allowable to conduct the treatment in the low out region again after the treatment in the high output region. In this case, an organic layer is formed on the surface of the film, and water resistance is improved.

When the plasma CVD is conducted by using the microwaves, it is desired to introduce the microwaves into the plasma treatment chamber intermittently as pulse waves. There can be used pulse waves of various waveforms such as square waves, triangular waves or semicircular waves.

When the microwaves are continuously produced and are introduced into the plasma treatment chamber, the interior of the plasma treatment chamber tends to be locally overheated causing the substrate to be thermally deformed. However, when the microwaves are intermittently introduced as pulse waves, the distribution of temperature of surface substrate is uniformly distributed in the plasma treatment chamber effectively preventing the interior of the plasma treatment chamber from being locally overheated. In the present invention, further, the microwaves of pulses of a waveform adapted to the treatment regions can be introduced into the plasma treatment chamber while maintaining the same energy (area) of pulse waves (i.e., maintaining the same microwave output E1 introduced into the plasma treatment chamber) by varying and adjusting the oscillation time (ON time) of the pulse waves and a maximum output (peak output).

Figure 6:
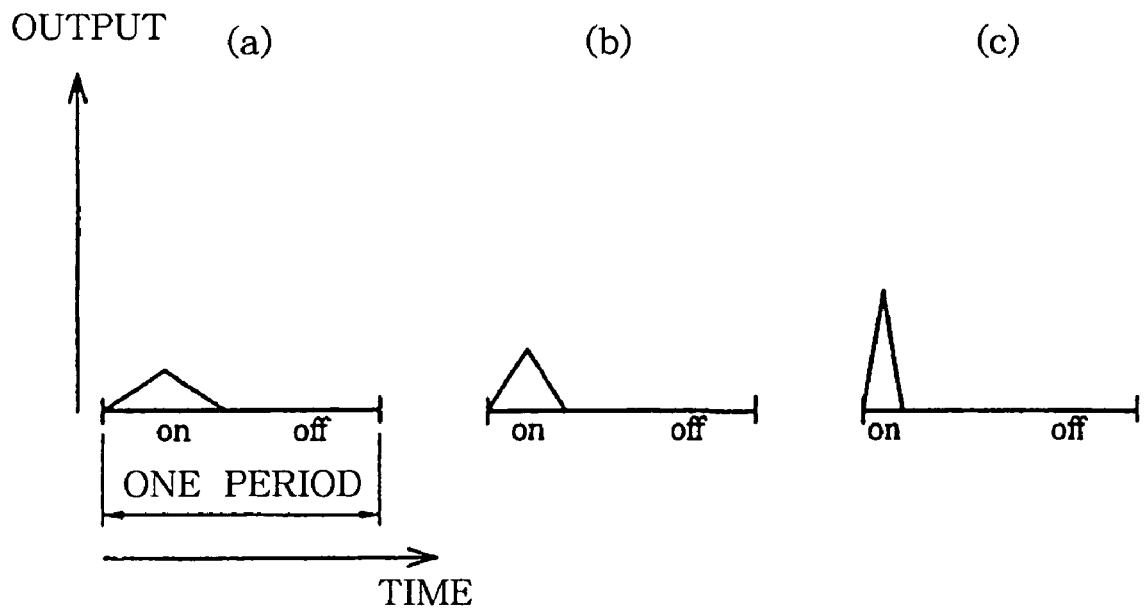
FIG. 6 is a diagram illustrating waveforms of pulse waves.

For example, the three kinds of pulse waves (a) to (c) shown in FIG. 6 have the same energy (area of pulse waves; average output (W)) but have different oscillation times (ON times) and different maximum outputs. Even though the microwave output is the same, adaptabilities to the treatment regions are different depending upon the waveforms of the pulse waves.

In the low output region (t1 to t3), for example, it is desired that the oscillation time (ON time) is short and that a pulse wave (c) has a high maximum output from the standpoint of ignition of the plasma. Concretely speaking, when one period of pulse wave is 10 milliseconds, it is desired that the oscillation time is shorter than 1.5 milliseconds and is, particularly, from 0.1 millisecond to 1 millisecond. The maximum output is suitably adjusted by taking into consideration the properties of the treatment gas used during the oscillation time and the microwave output introduced into the plasma treatment chamber. Usually, however, it is desired that the maximum output is 30 watts to 1000 watts. This quickens the ignition of the plasma (shortens the period of introduction) and improves the adhesiveness to the substrate. The holding period (t2 to t3) in the low output region is the time in which the organic layer having the above-mentioned thickness is formed and is, usually, from about 0.1 to about 6 seconds.

The shifting period (t3 to t4) after the low output region needs not necessarily be provided. By providing the shifting period, however, the carbon content in the organic layer can be gradually decreased, and the organic layer can be shifted into a metal oxide film to further improve its adhesiveness. During the shifting period, the oscillation time (ON time) and the maximum output are gradually increased. Usually, it is desired that the shifting period is from 0.5 to 6 seconds.

In the high output region (t4 to t5), further, it is desired that the oscillation time is long and that a pulse wave has a low maximum output from the standpoint of suppressing the generation of heat. Among, for example, the three kinds of pulse waves (a) to (c) shown in FIG. 6, the pulse wave (a) is excellent and it is desired that the oscillation time in one period of the output waveform is not shorter than 2 milliseconds. Further, a maximum output (peak output) is suitably adjusted by taking into consideration the properties of the treatment gas that is used and the heat resistance of the substrate, and is, for example, 300 watts to 1800 watts.

It is further desired that a stop time of microwaves in one period is from 2 milliseconds to 30 milliseconds throughout the whole region. Then, the microwaves of the next period are introduced after the after-glow of the plasma light emission becomes sufficiently small to effectively prevent the interior of the plasma treatment chamber from overheating.

There is no particular limitation on the microwaves that are introduced provided they act on the treatment gas to produce a glow discharge. Microwaves that are permitted to be industrially used in various countries can be used. In Japan, for instance, microwaves of 2.45 GHz, 5.8 GHz and 22.125 GHz are permitted to be used.

—Treatment Apparatus—

In the present invention, the apparatus used for the formation of a metal oxide film includes a plasma treatment chamber that contains the substrate to be treated, an exhaust system for maintaining the plasma treatment chamber in a reduced pressure condition, a treatment gas introduction system for introducing the treatment gas into the plasma treatment chamber, and an electromagnetic wave introduction system for generating a plasma in the plasma treatment chamber.

Figure 7:
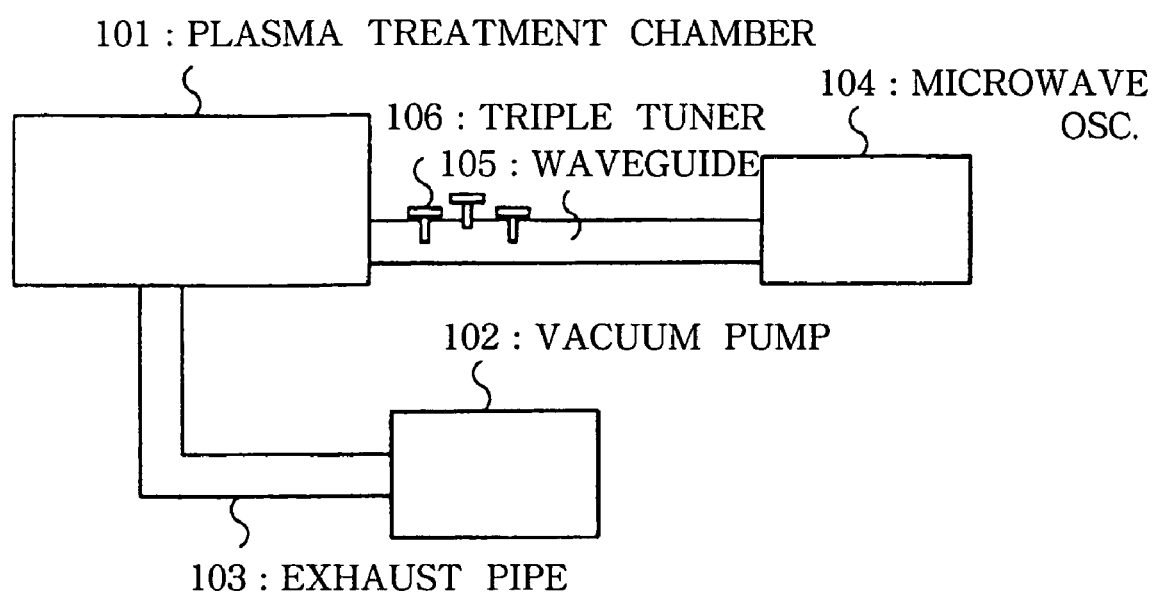
FIG. 7 is a diagram illustrating the schematic arrangement of a microwave plasma treatment apparatus used in the present invention.

FIG. 7 schematically illustrates the arrangement of the above apparatus which is a microwave plasma treatment apparatus.

In FIG. 7, a vacuum pump 102 is connected, via an exhaust pipe 103, to a plasma treatment chamber 101 to evacuate and maintain the interior of the treatment chamber 101 in a reduced pressure condition. Further, a microwave oscillator 104 is connected thereto via a waveguide 105 which is a microwave introduction means.

A triple tuner 106 may be provided to minimize the amount of microwaves reflected from the treatment chamber 101. Here, however, the tuner 106 simply works to forcibly decrease the amount of reflection, but is not capable of establishing an excellent resonance system in the plasma treatment chamber 101. Upon constituting the plasma treatment chamber 101 as shown in FIG. 8 as will be described later, an excellent resonance system can be established in the plasma treatment chamber 101, and an efficient treatment can be conducted without the need of using adjustment means such as tuner 106.

A waveguide 105 is to efficiently transmit the microwaves oscillated from the microwave oscillator 104 to the treatment chamber 101, and has a length which is adapted to the wavelength of the microwaves that are used. It is also allowable to use a coaxial cable instead of the waveguide.

The microwave oscillator 104 has a function of intermittently oscillating the microwaves as pulse waves and a function of changing the waveform of pulse waves into any shape. To change the waveform of pulse waves into any shape, there may be used a microwave oscillator employing a power source device that will be described.

Figure 8:
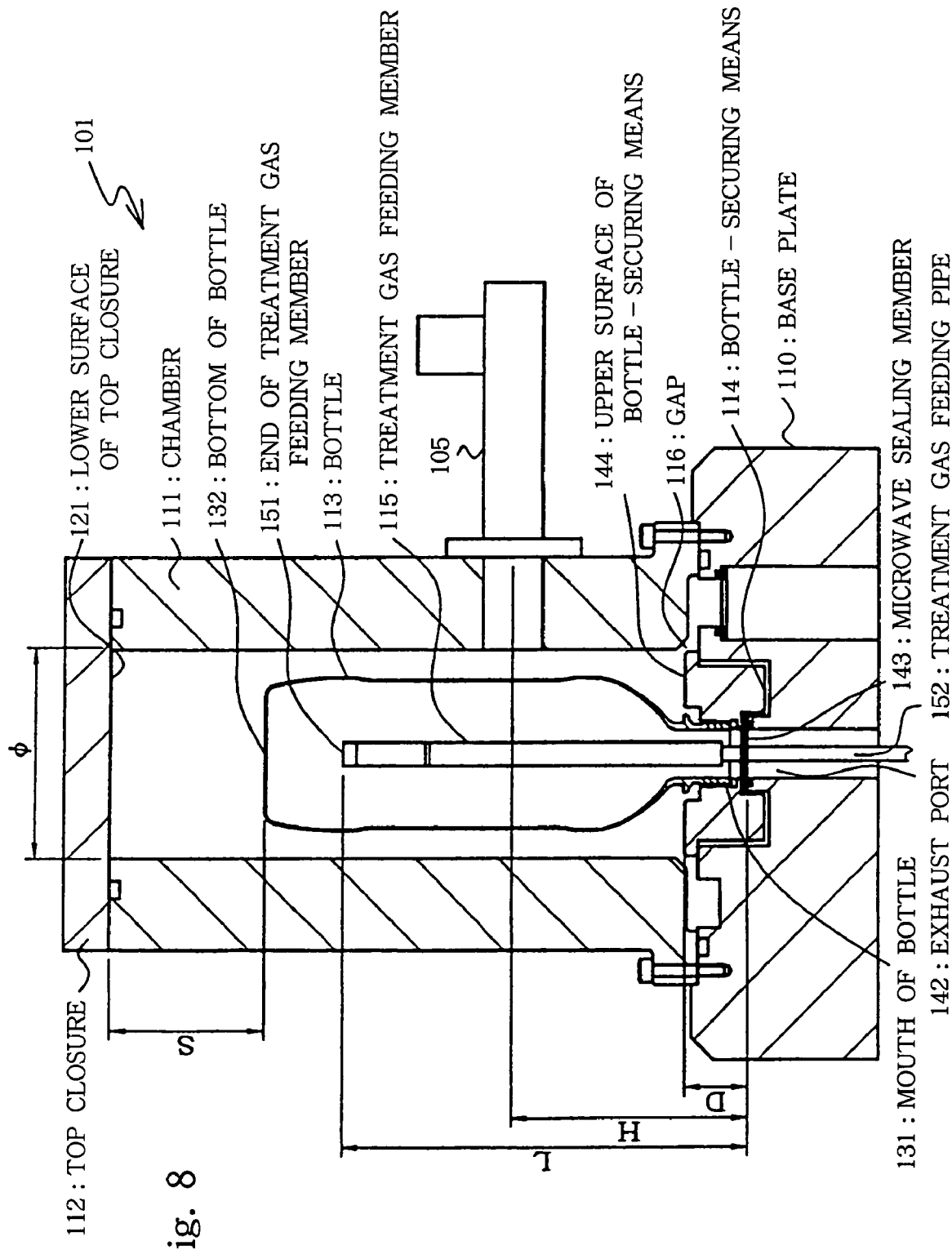
FIG. 8 is a diagram illustrating the arrangement of a plasma treatment chamber in the apparatus of FIG. 7.

FIG. 8 is a sectional view schematically illustrating the plasma treatment chamber used for forming a plasma-treated film on the inner surface of the bottle.

The plasma treatment chamber 101 is constituted by a hollow chamber 111 placed on a base plate 110, a detachable top closure 112 positioned on the chamber 111, and bottle-securing means 114 for securing a bottle 113 that is to be treated. The waveguide 105 is connected to the side surface of the chamber 111 to transmit the microwaves oscillated from the microwave oscillator 104 to the plasma treatment chamber 101.

The plasma treatment chamber 101 is forming a so-called microwave semi-coaxial cylindrical resonance system. Namely, the plasma treatment chamber 101 is formed by the cylindrical chamber 111, and an electrically conducting treatment gas feeding member 115 is provided on an axis thereof in a state that an end portion thereof is not reaching the top closure 112.

The bottle 113 is held at its mouth portion 131 by the bottle-securing means 114, secured on the axis of the chamber 111, and the treatment gas feeding member 115 is inserted in the bottle 113. In this state, the interior and the exterior of the bottle 113 is evacuated by a vacuum pump 102, the treatment gas is fed from the treatment gas feeding member 115 inserted in the central portion of the bottle 113, and microwaves are fed from the side surfaces of the treatment chamber 101.

A gap 116 is maintained between the chamber 111 and the bottle-securing means 114 in order to reduce the pressure in the treatment chamber 101, the gap 116 being communicated with an exhaust pipe 103 (not shown in FIG. 8) through the base plate 110. Similarly, in order to reduce the pressure in the bottle 113, an exhaust port 142 formed in the bottle-securing means 114 too is communicated with the exhaust pipe 103.

Further, a microwave sealing member 143 is provided so as to cover the exhaust port 142 to prevent the microwaves from leaking out of the treatment chamber 101. As the microwave sealing member 143, there can be used the one that permits the gas to pass through so will not to interrupt the step of reducing the pressure in the bottle 113 and can shut-off microwaves, such as a metal gauze made of, for example, SUS, Al or Ti.

The bottle-securing means is connected to a rod (not shown) that can be raised and lowered. When the bottle 113 is to be attached to or detached from the bottle-securing means 114, the top closure 112 is opened, the rod is raised to move the bottle 113 (securing means 114) up to the outer side of the chamber 111.

The treatment gas feeding member 115 is on the same axis as the chamber 111, is inserted in the bottle 113 penetrating through the bottle-securing means 114, and is connected to a treatment gas feeding unit (not shown) through a treatment gas feeding pipe 152 so as to feed the gas at a predetermined rate.

The material forming the treatment gas feeding member 115 may be a metal such as SUS, Al or Ti. When a chemically evaporated film is to be formed on the inner surface of the bottle 113, it is desired to use a porous metal from the standpoint of improving uniformity, softness and flexibility of the obtained thin film layer as well as improving the productivity.

The treatment gas feeding member 115 has one or more holes for releasing the gas. The positions, sizes and number of the holes can be arbitrarily set. On the surface of the treatment gas feeding member 115, there can be formed, in advance, the same film as the one that is formed on the inner surface of the bottle 113 by the plasma treatment.

The film is formed on the inner surface of the bottle 113 by using the treatment apparatus equipped with the above plasma treatment chamber 101 in a manner, for example, as described below.

First, the mouth portion 131 of the bottle 113 is held by the bottle-securing means 114. Here, the top closure 112 has been removed from the chamber 111, and the bottle-securing means 114 is raised in the chamber 111 by the rod (not shown) and is positioned at an upper part of the chamber 111.

In this state, the rod is lowered such that the bottle-securing means 114 is disposed at a predetermined position. Then, the top closure 112 is closed to seal the interior of the chamber 111 to establish a state shown in FIG. 8.

Then, the vacuum pump 102 is driven to reduce the pressure in the bottle 113. Here, in order to prevent the bottle 113 from being deformed by the external pressure, it is desired that the pressure in the plasma treatment chamber 101 surrounding the bottle is reduced by the vacuum pump 102.

The degree of reduction of pressure in the bottle 113 may be such that a glow discharge occurs when the treatment gas is introduced and the microwaves are introduced. In general, it is desired that the pressure is reduced down to 1 to 500 Pa and, particularly, 5 to 200 Pa from the standpoint of efficiently conducting the plasma treatment.

On the other hand, the reduction of pressure in the plasma treatment chamber 101 surrounding the bottle 113 is such that there occurs no glow discharge even when the microwaves are introduced, i.e., 1000 to 10000 Pa.

After the condition of a reduced pressure is reached, the treatment gas is supplied into the bottle 113 from the treatment gas feeding member 115.

Referring; for example, to a case of using an organosilicon compound as an organic metal, it is desired that the starting silicon material is supplied at a flow rate which is relatively as small as 0.5 to 50 cc/min and, particularly, 1 to 10 cc/min (hereinafter often simply written as sccm) in a standard state per a container when the substrate is a plastic container, though it may vary depending upon the surface areas of the substrate to be treated and the kind of the starting gas.

The amount of introducing the oxidizing gas may vary depending upon the composition of the starting silicon gas but is, usually, 5 to 500 sccm and, particularly desirably, as relatively large as 10 to 300 sccm.

When a thin film is to be formed by the reaction of a plurality of treatment gases, some treatment gases may be supplied in an excess amount. For example, when a silicon oxide film is to be formed, it is desired that the oxygen gas is fed in an excess amount as compared to the silicon source gas. When a nitride is to be formed, nitrogen or ammonia is fed in an excess amount as compared to the metal source gas.

Microwaves are introduced into the plasma treatment chamber 101 through the waveguide 105 in a state where the treatment gas is fed into the bottle 113. As described above, it is desired that the microwaves are the pulse waves of which the output and waveform are adjusted for each of the treatment regions. Such microwaves enable the treatment gas to acquire high energy and to acquire a state of plasma. The plasmatic treatment gas acts and deposits on the inner surface of the bottle 113 to form a film thereon.

The treatment time must not, for example, be shorter than one second per a bottle from the standpoint of maintaining safety in the plasma treatment. So far as at least the film having the above-mentioned thickness is formed, however, it is desired that the treatment time is short from the standpoint of cost.

After the plasma treatment is executed, the supply of the treatment gas and the introduction of the microwaves are discontinued and, instead, the air is gradually introduced through the exhaust pipe 103 to return the pressures in the interior and exterior of the bottle 113 to normal pressure. Then, the top closure 112 is removed, the bottle-securing means 114 is raised, and the bottle treated with plasma is taken out from the plasma treatment chamber 101.

In the above-mentioned apparatus, it is desired that the distance (D) from the upper surface 144 of the bottle-securing means 114 to the microwave sealing member 143 is 0 mm to 55 mm and, particularly, 20 mm to 50 mm. Upon selecting the distance (D) to lie within this range, an excellent resonance system is established in the treatment chamber 101 to stabilize the distribution of electric field intensities due to the microwaves. Accordingly, the generation of plasma is stabilized and the energy of the introduced microwaves is utilized more efficiently.

Further, the distance (H) between the microwave sealing member 143 and the position where the microwave introduction means 105 is connected, represents a nodal portion in the distribution of the electric field intensities formed on the treatment gas feeding member 115, i.e., represents a gap between the portions where the electric field density is low. It is therefore desired to set the distance (H) depending upon the wavelength of the introduced microwaves in order to minimize the waves that are not consumed in the treatment chamber 101 but that travel reversely through the waveguide 105 and to efficiently utilize the introduced microwaves for producing a plasma of the treatment gas. When use is made of, for example, the microwaves having a frequency of 2.45 GHz, the wavelength of the microwaves is about 120 mm, and it has been known through experiment and analysis by a computer program that the distances (H) are desirably 48 mm, 108 mm and 168 mm. Here, the distance (L) between the microwave sealing member 143 and the end 151 of the treatment gas feeding member is suitably selected depending upon the distance (D) in order to generally enhance the electric field intensity due to the microwaves and to stabilize the distribution of electric field intensities. When the distance (D) is set to be, for example, 30 mm, the distances (L) for obtaining a stable plasma light emission are 60±10 mm, 120±10 mm, 180±10 mm, etc.

In order to form a film of a uniform thickness on the whole inner surface of the bottle 113, therefore, it is desired to select the above distances (H) and (L) depending upon the shape and size of the bottle 113 to be treated, so that the end 151 of the treatment gas feeding member is located at a position close to the bottle bottom portion 132. For example, for treating a bottle having a content of 500 ml, the distance (L) is generally 170 to 190 mm and for treating a bottle having a content of 350 ml, the distance (L) is generally 110 to 130 mm.

It is further desired that the distance (S) from the bottom 132 of the bottle to the lower surface 121 of the top closure is 5 mm to 150 mm and, particularly, 30 mm to 100 mm. Within this range, the matching is improved between the chamber 111 and the microwaves, and the distribution of electric field intensities is more stabilized in the treatment chamber 101.

It is further desired that the treatment chamber 101 has an inner diameter (Φ) of 40 mm to 150 mm and, particularly, 65 to 120 mm. Upon selecting the inner diameter of the treatment chamber 101 to lie within this range, there is exhibited the effect for concentrating the electric field in the center of the treatment chamber 101.

—Microwave Power Source Device—

In the present invention, it is desired to use the following power source device as the microwave oscillator 104 in order to change the waveform of pulse wave into any shape. The microwave power source device can be realized in two modes as will be described below.

First Embodiment

First, the whole constitution of the microwave power source device according to a first embodiment of the invention will be described with reference to FIG. 9 which is a block diagram illustrating the circuit constitution thereof.

Figure 9:
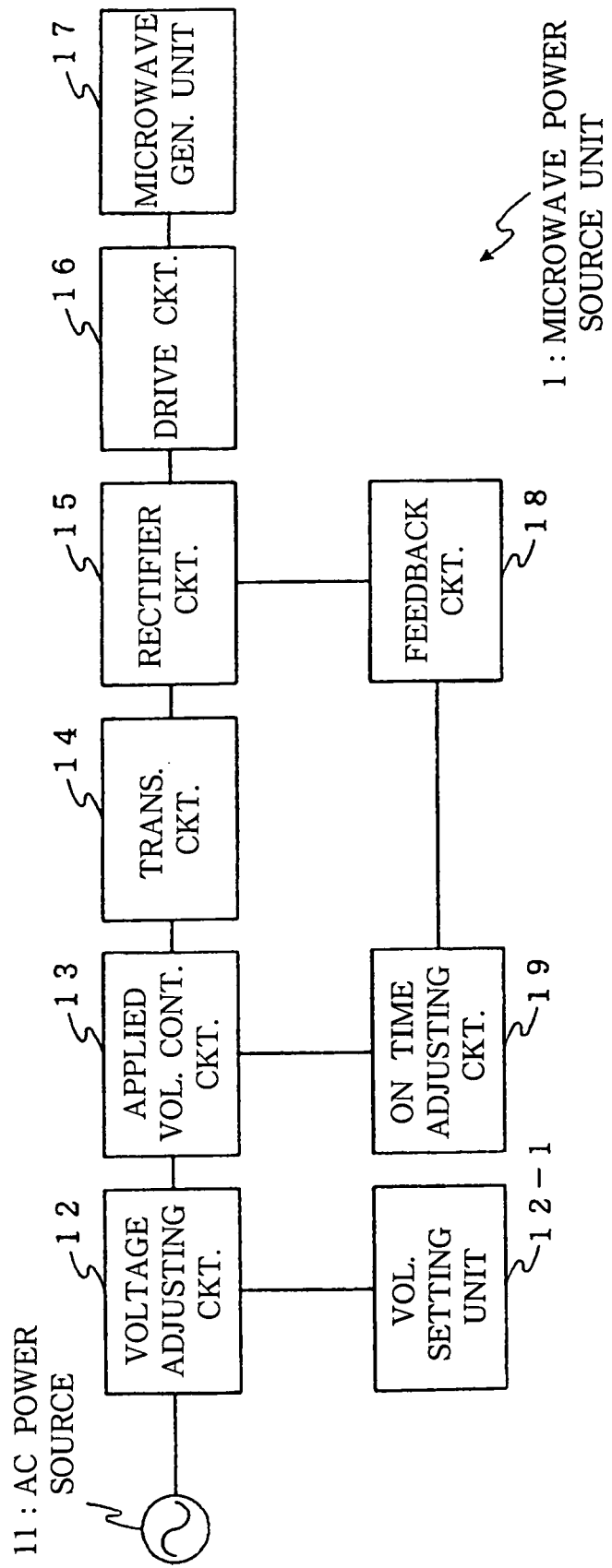
FIG. 9 is a block diagram illustrating the constitution of a microwave power source device according to a first embodiment of the present invention.

Referring to FIG. 9, the microwave power source device 1 includes an AC power source 11, a voltage adjusting circuit 12, a voltage setting unit 12-1, an application voltage control circuit 13, a transformer circuit 14, a rectifier circuit 15, a drive circuit 16, a microwave generator unit 17, a feedback circuit 18 and an ON time adjusting circuit 19.

The AC power source 11 is a commercial power source of, for example, 200 [V](or 100 [V]). It is also allowable to use a storage battery having the same voltage. In this case, no smoothing circuit is necessary.

The voltage adjusting circuit 12 is a voltage variable circuit for adjusting a power source voltage fed from the AC power source 11 to any voltage upon being operated by the user, and for applying it to the application voltage control circuit 13. As the voltage adjusting circuit 12, there can be employed, for example, a transformer or a slidac.

Further, the power source voltage can be adjusted to any voltage depending upon an external signal. For example, the voltage is set to be high at the time of a low output and is set to be low at the time of a high output.

The voltage setting unit 12-1 sets a maximum voltage (peak voltage) adjusted by the voltage adjusting circuit 12.

Based on a maximum value (peak voltage) of an application voltage determined by the voltage adjusting circuit 12 and on an ON time (voltage application time) determined by the ON time adjusting circuit 19, the applied voltage control circuit 13 forms a waveform of the voltage applied to the microwave generator unit 17.

The transformer circuit 14 includes a booster transformer and boosts a voltage sent from the applied voltage control circuit 13.

The rectifier circuit 15 rectifies the full waves of a high voltage boosted through the transformer circuit 14.

The drive circuit 16 applies a rectified high voltage from the rectifier circuit 15 to the microwave generator unit 17 to drive the microwave generator unit 17. In this embodiment, the voltage applied to the microwave generator unit 17 is called applied voltage.

The microwave generator unit 17 generates microwaves based on the waveform of the applied voltage (maximum voltage and ON time), and generates microwaves as pulse waves of which the waveform being adjusted as described earlier.

The feedback circuit 18 sends the voltage received from the rectifier circuit 15 to the ON time adjusting circuit 19. Namely, the feedback circuit 18 sends, to the ON time adjusting circuit 19, a voltage corresponding to a voltage applied to the microwave generator unit 17.

In order to determine the ON time of applied voltage applied to the microwave generator unit 17, the ON time adjusting circuit 19 sends a predetermined signal (e.g., trigger or the like formed at a predetermined timing) to the applied voltage control circuit 13 (or controls the operation of the applied voltage control circuit 13) based on a voltage from the feedback circuit 18.

With the microwave power source device being constituted as described above, the voltage applied to the microwave generator unit can be adjusted and controlled based on the voltage set by the voltage adjusting circuit and on the ON time determined by the ON time adjusting circuit.

It is therefore allowed to change the output intensity of the microwaves emitted from the microwave generator unit, to oscillate the microwaves as pulse waves of waveforms suited for the treatment regions, and to form a thin film having both excellent barrier property and adhesiveness.

In FIG. 9, the constituent units from the AC power source 11 to the microwave generator unit 18 are arranged in order of AC power source 11—voltage adjusting circuit 12—applied voltage control circuit 13—transformer circuit 14—rectifier circuit 15—drive circuit 16—microwave generator unit 17. Not being limited to the above arrangement only, however, they may be arranged in order of, for example, AC power source 11—voltage adjusting circuit 12—transformer circuit 14—applied voltage control circuit 13—rectifier circuit 15—drive circuit 16—microwave generator unit 17, or AC power source 11—voltage adjusting circuit 12—transformer circuit 14—rectifier circuit 15—applied voltage control circuit 13—drive circuit 16—microwave generator unit 17, or AC power source 11—voltage adjusting circuit 12—applied voltage control circuit 13—rectifier circuit 15—transformer circuit 14—drive circuit 16—microwave generator unit 17.

Here, however, the arrangement of the constituent units of from the AC power source 11 to the microwave generator unit 17 must be such that the microwaves are generated from the microwave generator unit 17 and that the applied voltage to the microwave generator unit 17 is adjusted.

The concrete circuit constitution of the microwave power source device shown in FIG. 9 will now be described with reference to FIG. 10.

Figure 10:
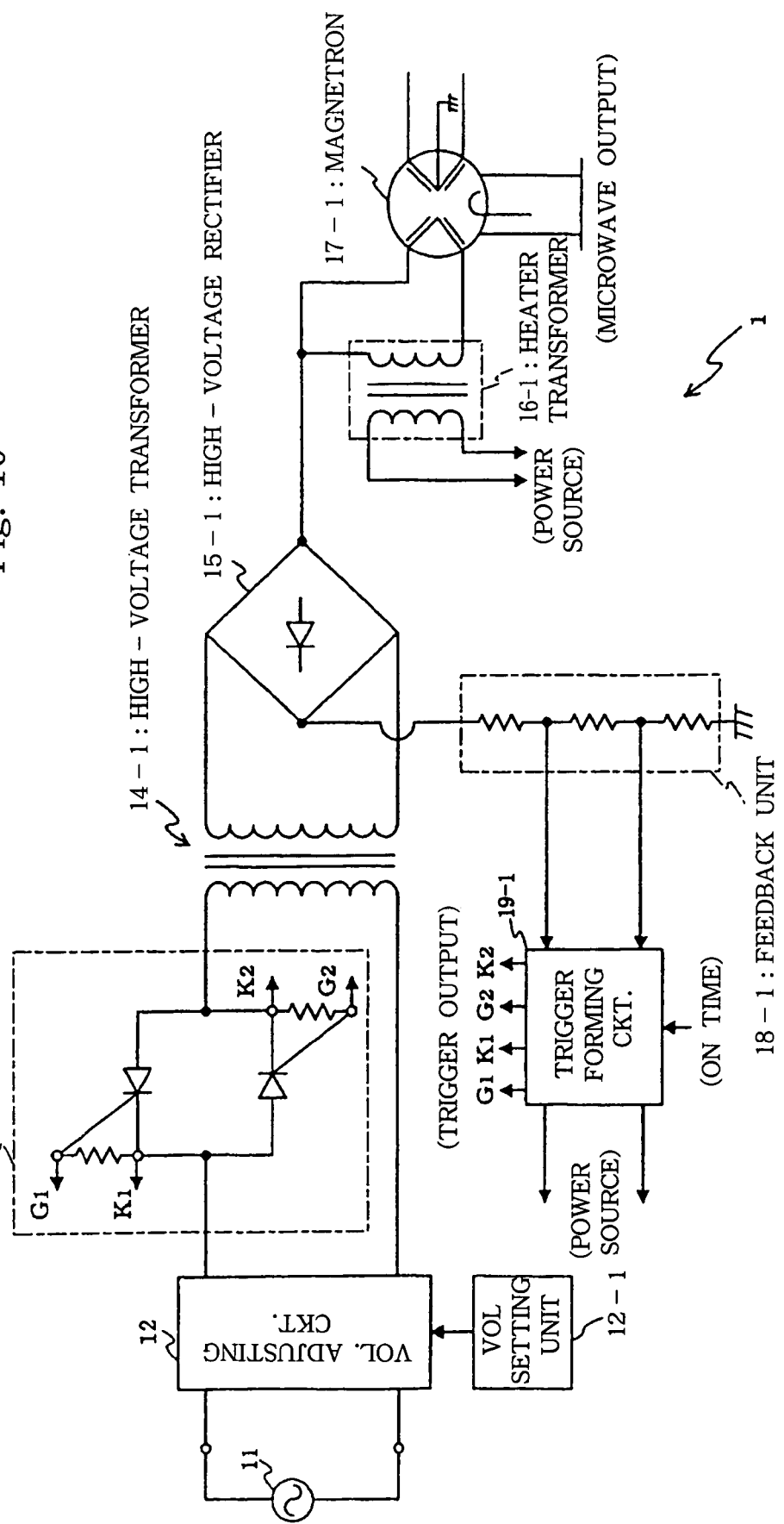
FIG. 10 is a diagram of an electric circuit concretely illustrating the circuit constitution of the microwave power source device of FIG. 9.

FIG. 10 is a diagram of an electric circuit illustrating the circuit constitution of a microwave power source device comprising a circuit that generates microwaves by applying a voltage to the microwave generator unit (magnetron) based on the iron transformer system, and is further provided with a voltage adjusting circuit, a feedback circuit, an ON time adjusting circuit and an applied voltage control circuit.

Referring to FIG. 10, the microwave power source device 1 includes an AC power source 11, a voltage adjusting circuit 12, a voltage setting unit 12-1, an SCR phase control unit 13-1, a high-voltage transformer 14-1, a high-voltage rectifier 15-1, a heater transformer 16-1, a magnetron 17-1, a feedback unit 18-1, and a trigger forming circuit 19-1.

The voltage adjusting circuit 12 is equipment (or apparatus, circuit, device, etc.) capable of converting the power source voltage sent from the AC power source 11 to any voltage, and may be, for example, a slidac, a transformer, an automatically variable slidac (e.g., the one capable of varying the input voltage of 200 V from 0 V through up to 220 V based on an input of 0 V to 5 V)(slidac system, transformer system).

Therefore, the voltage setting unit 12-1 has a function for adjusting a maximum value (peak voltage) of the applied voltage and a function for forming the applied voltage so as to accomplish the adjusted maximum voltage value.

The voltage setting unit 12-1 sets a maximum value (peak voltage) of the power source voltage adjusted by the voltage adjusting circuit 12.

The SCR phase control unit (phase control unit) 13-1 is constituted by a circuit of a combination of two thyristors (or a circuit including a triac), and controls the phase of the sinusoidal wave AC voltage supplied from the voltage adjusting circuit 12. The phase control will be described later in detail.

The high-voltage transformer 14-1 boosts the AC voltage of which the phase is controlled by the SCR phase control unit 13-1.

The high-voltage rectifier 15-1 full-wave-rectifies the voltage boosted by the high-voltage transformer 14-1, and applies it to the anode of the magnetron 17-1. The voltage output from the high-voltage rectifier 15-1 is applied to the magnetron 17-1 to drive it. Therefore, the high-voltage rectifier 15-1 works as a drive circuit 17.

The heater transformer 16-1 supplies electric power to the heater (not shown) of the magnetron 17-1 to heat the cathode (negative pole filament of the magnetron 17-1). Therefore, the magnetron 17-1 assumes a state of easily emitting electrons.

The magnetron 17-1 emits the microwaves based on the peak voltage and the ON time of the applied voltage from the high-voltage rectifier 15-1.

The following phenomenon is taking place in the magnetron 17-1.

When the applied voltage is smaller than a predetermined voltage (cut-off voltage), the resistance is so high that no microwave is generated. When the cut-off voltage is exceeded, however, the resistance becomes low, whereby the electrons emitted from the cathode arrive at the anode to thereby close the loop together with other circuits (e.g., high-voltage circuit, secondary winding, etc.), and a magnetron current (anode current) flows across the anode and the cathode. Here, the electric power generated in the magnetron 17-1 is converted into microwaves maintaining a certain conversion efficiency and are radiated.

The feedback unit 18-1 receives, from the high-voltage rectifier 15-1, a voltage of a value equal to the voltage applied to the magnetron 17-1.

In FIG. 10, the feedback unit 18-1 is receiving a voltage from the high-voltage rectifier 15-1. Not being limited to the high-voltage rectifier 15-1, however, the voltage may be received from, for example, the vicinity of the anode of the magnetron 17-1.

Figure 11:
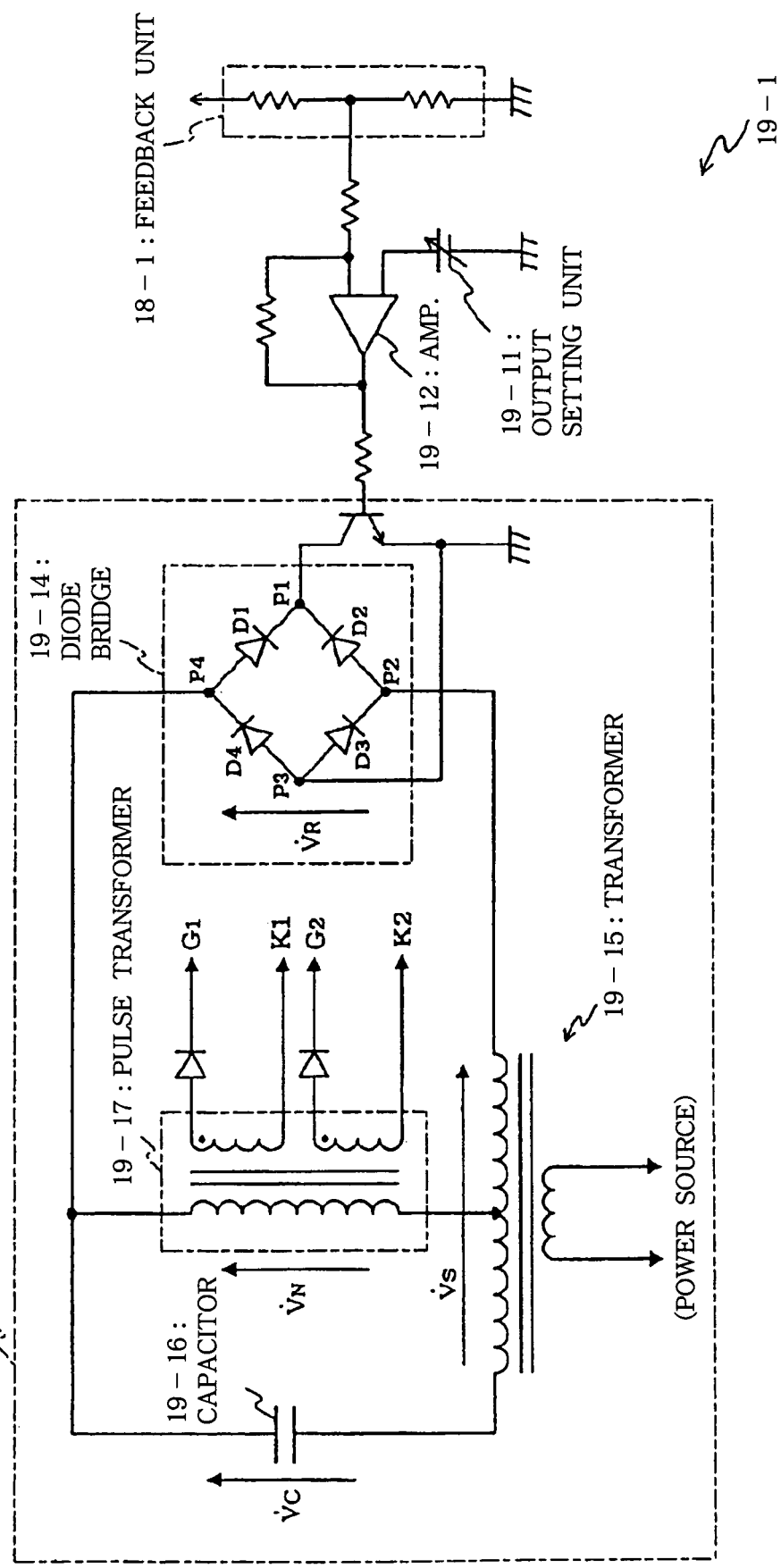
FIG. 11 is a diagram of an electric circuit illustrating the internal constitution of a trigger circuit.

Referring to FIG. 11, the trigger forming circuit 19-1 includes an output setting unit 19-11, an amplifier 19-12 and a Toulon's phase sift circuit 19-13.

The output setting unit 19-11 includes a voltage source such as a variable voltage source or a variable capacitor, and varies the voltage output from the voltage source in order to adjust the ON time of the voltage applied to the magnetron 17-1 (or to adjust the electric power fed to the magnetron 17-1).

The amplifier 19-12 amplifies the voltage of a predetermined value sent from the feedback unit 18-1 and the voltage set by the output setting unit 19-11, and feeds them to the Toulon's phase sift circuit 19-13.

The Toulon's phase sift circuit 19-13 includes a diode bridge 19-14, a transformer 19-15, a capacitor 19-16 and a pulse transformer 19-17.

The diode bridge 19-14 is constituting a bridge by using four diodes (D1, D2, D3 and D4). These four diodes are connected at P1 (connection point of the cathode of D1 and the cathode of D2), P2 (connection point of the anode of D2 and the cathode of D3), P3 (connection point of the anode of D3 and the anode of D4), and P4 (connection point of the cathode of D4 and the anode of D1).

Among these connection points, the voltage from the amplifier 19-12 is received across P1 and P3. Based on this voltage, a voltage $V_R$ (hereinafter referred to as "vector $V_r$") generates across P2 and P4.

In this embodiment, the diode bridge 19-14 and the capacitor 19-16 together are referred to as "ON time adjusting unit".

The transformer 19-15 transforms the power source voltage, and applies the transformed voltage to the diode bridge 19-14 and to the capacitor 19-16. Therefore, the vector $V_R$ generates across P2 and P4 of the diode bridge 19-14, and a voltage $V_C$ (hereinafter referred to as "vector $V_C$") generates across the capacitor 19-16.

The pulse transformer (trigger generator unit) 19-17 generates a trigger and applies it to the SCR phase control unit 13-1.

A relationship of voltages among the constituent portions in the Toulon's phase sift circuit 19-13 is as described below.

The diode bridge 19-14 and the capacitor 19-16 are connected in series with the transformer 19-15, and a secondary voltage $V_S$ (hereinafter referred to as "vector $V_S$") of the transformer 19-15 is applied across both terminals of the diode bridge 19-14 and the capacitor 19-16 that are connected in series.

Figure 12:
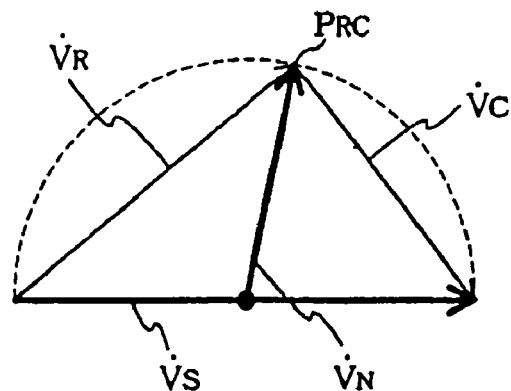
FIG. 12 is a vector diagram illustrating a relationship of voltages at various portions in a Toulon's phase sift circuit.

Then, the diode bridge 19-14 produces the vector $V_R$ and the capacitor 19-16 produces the vector $V_C$. As shown in FIG. 12, however, the phases of these vectors are deviated by 90° (the vector $V_R$ is delayed behind the vector $V_C$ by 90°). If these vectors are synthesized together, there is formed a vector $V_S$ (vector $V_R$+vector $V_C$=vector $V_S$).

The pulse transformer 19-17, on the other hand, is connected in parallel with the diode bridge 19-14 and the capacitor 19-16. Further, one terminal of the pulse transformer 19-17 is connected to just the central portion of the secondary winding of the transformer 19-15.

Therefore, the voltage $V_N$ (hereinafter referred to as "vector $V_N$") generated by the pulse transformer 19-17 has its start point at a position where the vector $V_S$ is equally divided into two.

Further, the vector $V_R$ and the vector $V_C$ has a phase difference of 90° relative to each other. Therefore, if the start point of the vector $V_R$ is brought to the start point of the vector $V_S$ and if the end point of the vector $V_C$ is brought to the end point of the vector $V_S$, then, a point $P_{RC}$ where the end point of the vector $V_R$ overlaps the start point of the vector $V_C$ exists somewhere on the circumference of a semicircle with the vector $V_S$ as the diameter.

Then, the vector $V_N$ produced by the pulse transformer 19-17 has its end point positioned on the point $P_{RC}$.

Further, the vector $V_R$ varies its value depending upon the voltage from the amplifier 19-12. Therefore, the point $P_{RC}$ moves on the circumference of a semicircle with the vector $V_S$ as the diameter. Accompanying this motion, the vector $V_N$ maintains its magnitude constant and varies its phase from 0° up to nearly 180°.

At this moment, the timing of the trigger generated by the pulse transformer 19-17 complies with the phase of the vector $V_N$. Accordingly, the Toulon's phase sift circuit 19-13 determines the timing for generating a trigger based on the voltage set by the output setting unit 19-11 and on the voltage from the feedback unit 18-1.

Then, the SCR phase control unit (phase control unit) 13-1 receives a trigger from the pulse transformer 19-17 through the gates and cathodes of the two thyristors and controls the phase of the AC voltage from the voltage adjusting circuit 12.

Though FIG. 10 uses two thyristors, it is also allowable to use a triac instead of the two thyristors.

Figure 13:
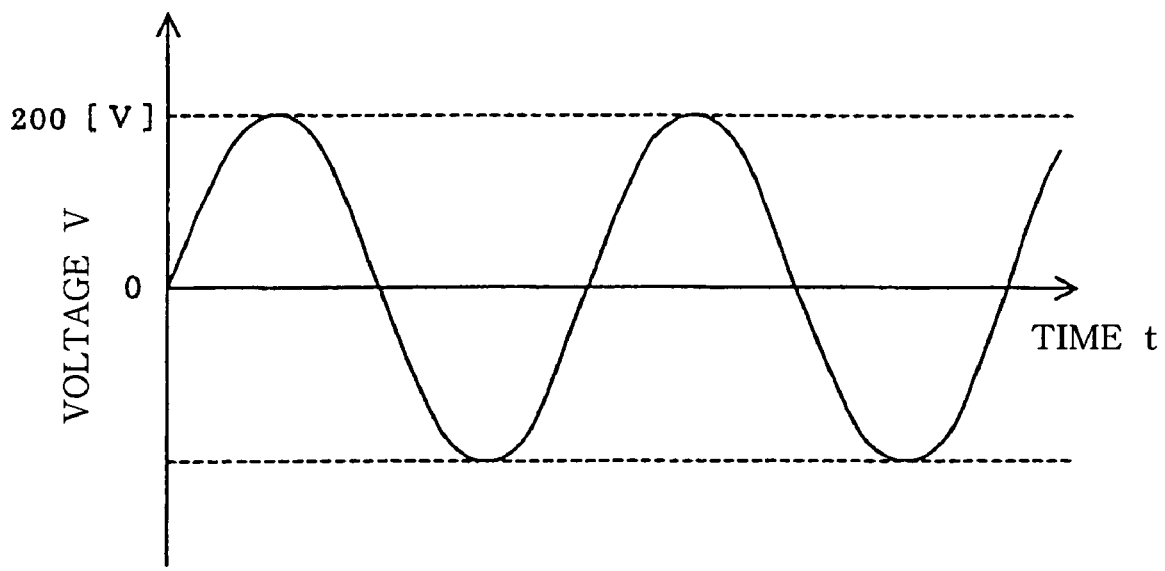
FIG. 13 is a graph of a curve illustrating a waveform of an AC power source in the microwave power source device shown in FIG. 9.

Next, described below with reference to FIG. 13 is how the applied voltage is adjusted and controlled in the above-mentioned microwave power source device 1.

Referring to FIG. 13, it is now presumed that the power source voltage of the AC power source 11 is an AC sinusoidal wave voltage having a maximum voltage (peak voltage) of 200 [V].

Figure 14:
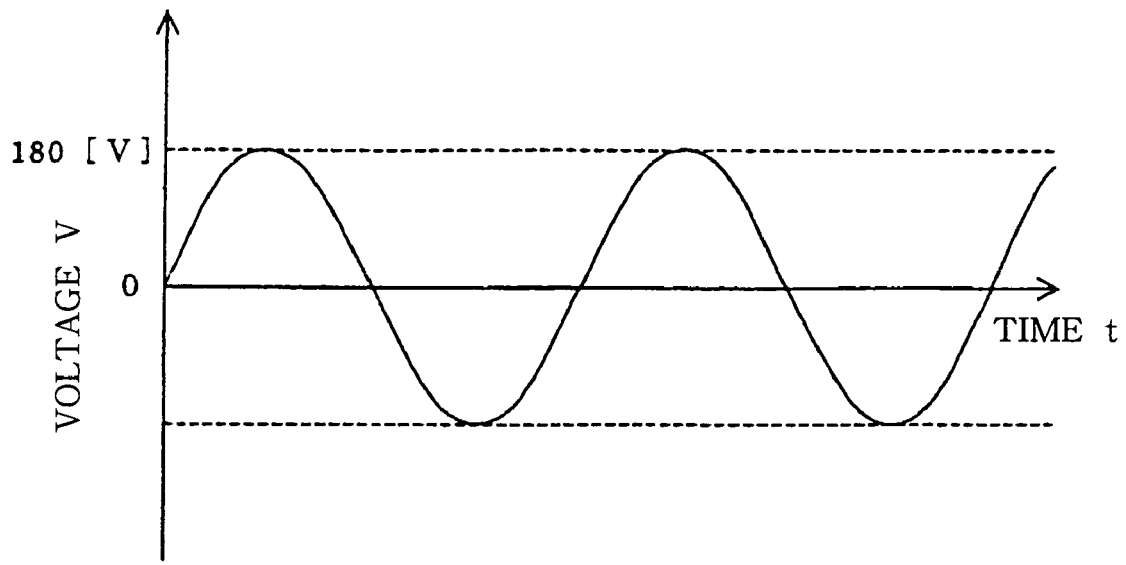
FIG. 14 is a graph of a curve illustrating the waveform of an AC power source in the microwave power source device shown in FIG. 9 decreased through a voltage adjusting circuit.

The power source voltage exhibiting 200 [V] is set and adjusted for its maximum voltage to assume any voltage through the voltage adjusting circuit 12. If now set to be, for example, 180 [V] through the voltage setting unit 12-1, then, the power source voltage that had exhibited 200 [V] is now adjusted through the voltage adjusting circuit 12 to exhibit 180 [V] as shown in FIG. 14.

The voltage can be differently adjusted by the voltage adjusting circuit 12 in each of the regions while the film is being formed. For example, the voltage can be adjusted and set to 205 [V] in the low output region, and can be adjusted and set to 165 [V] in the high output region.

Thus, by adjusting the power source voltage through the voltage adjusting circuit 12, the peak voltage applied to the magnetron 17-1 can be adjusted.

Besides, in the step of forming a film, the voltage is differently adjusted (maximum voltage (peak voltage) of the applied voltage is adjusted) depending on the low output region and the high output region.

Therefore, even the microwaves generated by the magnetron 17-1 can be output differently depending on the low output region and the high output region.

Here, however, the voltage is not adjusted, and the secondary voltage of the voltage adjusting circuit 12 exhibits a maximum value of 200 [V].

Figure 15:
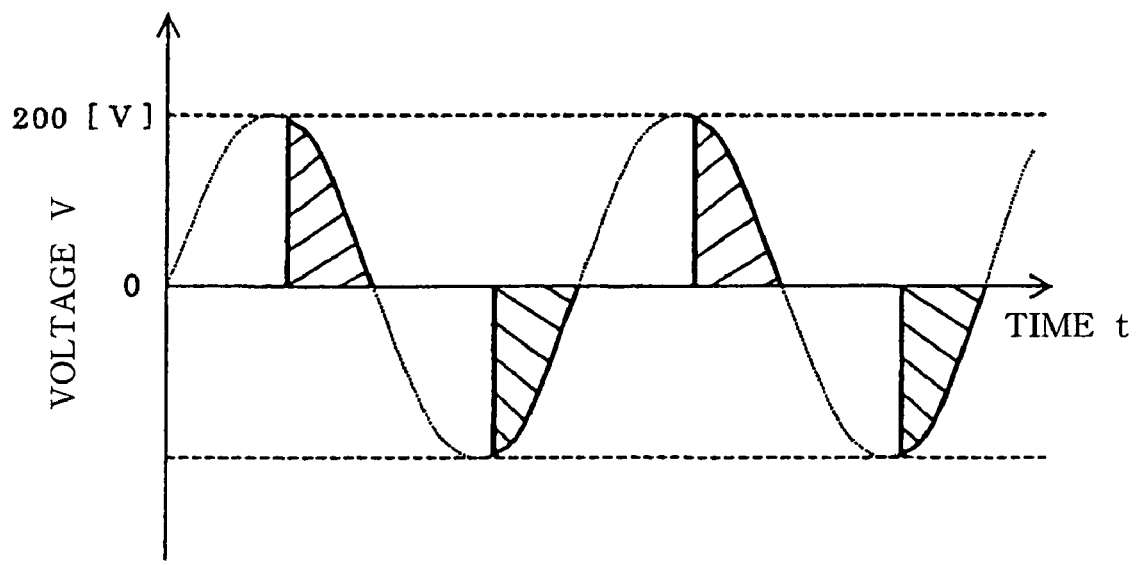
FIG. 15 is a graph of a curve illustrating the waveform of the AC power source in the microwave power source device shown in FIG. 10 controlled for its phase by an SCR phase control unit.

Then, the AC voltage from the voltage adjusting circuit 12 is controlled for its phase by the SCR phase control unit 13-1 to assume a waveform as shown in FIG. 15.

Figure 16:
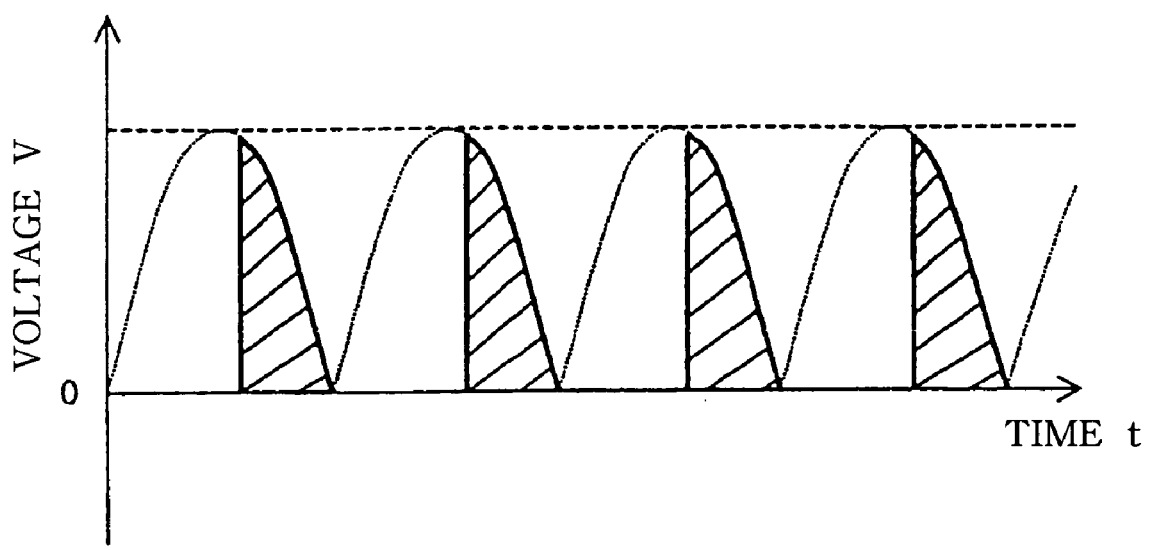
FIG. 16 is a graph of a curve illustrating the waveform of when the AC power source that is phase-controlled as shown in FIG. 15 is full-wave rectified.

The AC voltage of which the phase is controlled is boosted through the high-voltage transformer 14-1, and is full-wave-rectified through the high-voltage rectifier 15-1 thereby to obtain a full-wave-rectified waveform of which the phase is controlled as shown in FIG. 16.

The phase-controlled and full-wave-rectified voltage (applied voltage) is applied to the anode of the magnetron 17-1. As the cathode is heated by the heater transformer 16-1, microwaves are emitted from the magnetron 17-1.

Here, a voltage having a value same as the voltage applied to the magnetron 17-1 is received by the trigger forming circuit 19-1 from the high-voltage rectifier 15-1 through the feedback unit 18-1. Further, the output setting unit 19-11 sets a predetermined ON time.

The voltage from the feedback unit 18-1 and the voltage from the output setting unit 19-11 are amplified through the amplifier 19-12, and are applied to the diode bridge 19-14 in the Toulon's phase sift circuit 19-13.

Due to the application of the amplified voltage, the vector $V_R$ of the diode bridge 19-14 exhibits a value corresponding to the applied voltage.

Figure 17:
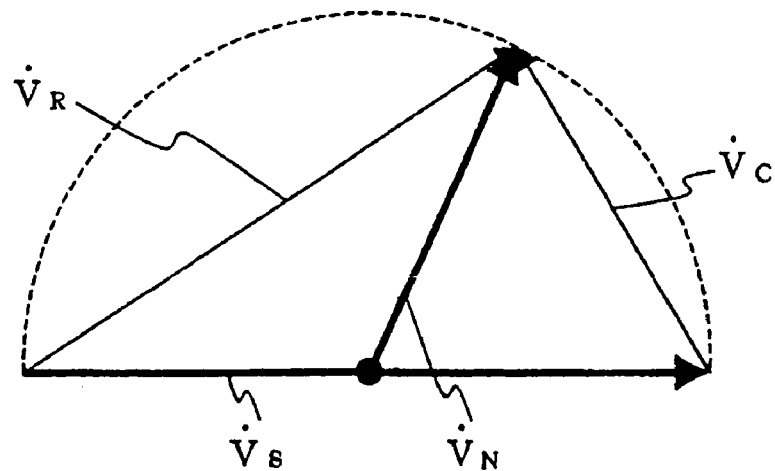
FIG. 17(a) is a vector diagram illustrating a relationship of voltages of various portions in the Toulon's phase sift circuit of when the phase of the voltage $V_N$ generated by a pulse transformer in the Toulon's phase sift circuit is advancing.
FIG. 17(b) is a graph illustrating the timings for generating a trigger in the relationship of FIG. 17(a)
Figure 17:
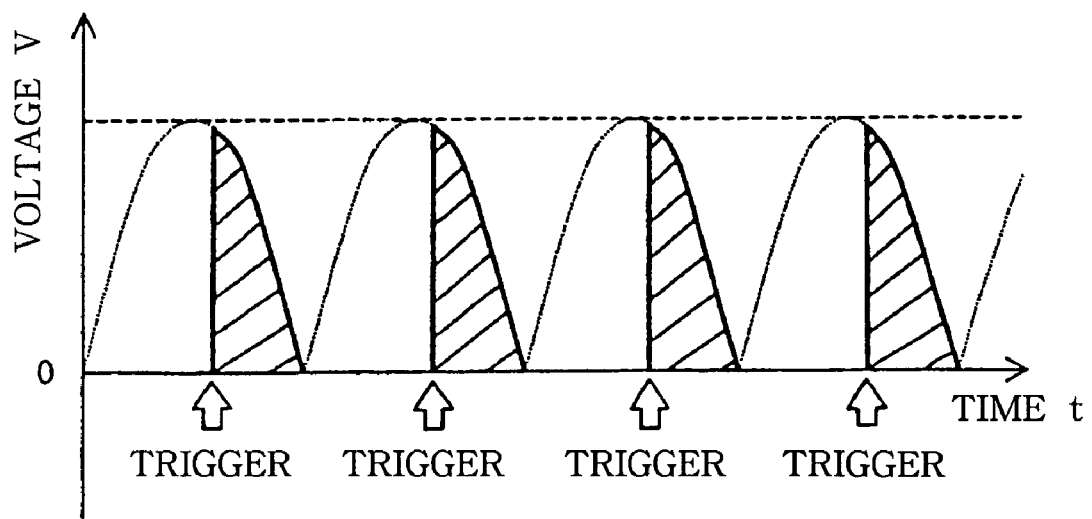

Here, if an absolute value of the vector $V_R$ of the diode bridge 19-14 becomes greater than an absolute value of the vector $V_C$ of the capacitor 19-16 (FIG. 17(a)), a trigger is generated by the trigger forming circuit 19-1 at a moment slightly after a peak in the sinusoidal waveform of the power source voltage depending upon the phase of the vector $V_N$ of the pulse transformer 19-17 (since the vector $V_N$ is leading in advance of the upper half (not shown) that starts with the middle point of the vector $V_S$ of the vertical bisector of the vector $V_S$) (see FIG. 17(b)).

When the trigger is generated, the SCR phase control unit 13-1 is operated, and the power source voltage from the voltage adjusting circuit 12 is controlled for its phase.

Then, the applied voltage that is boosted and rectified assumes a waveform as shown in FIG. 17(b) and is applied to the magnetron 17-1 to start producing the microwaves.

In the foregoing description, the setpoint of the output setting unit 19-11 is maintained constant. By adjusting the output setting unit 19-11, however, it is allowed to adjust the ON time at the same maximum voltage and to adjust the electric power of the voltage applied to the magnetron 17-1.

As shown in FIG. 14, on the other hand, if the power source voltage of the AC power source 11 exhibiting a maximum voltage of 200 [V] is set to be slightly low through the voltage setting unit 12-1 (e.g., set to 180 [V]), the voltage applied to the diode bridge 19-14 in the Toulon's phase sift circuit 19-13 varies, too, provided the setpoint of the output setting unit 19-11 remains constant. Accordingly, the vector $V_R$ of the diode bridge 19-14 varies, too.

Figure 18:
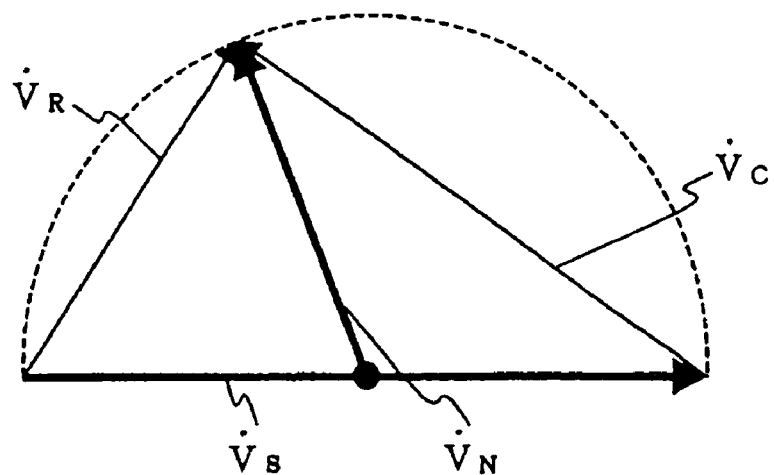
FIG. 18(a) is a vector diagram illustrating a relationship of voltages of various portions in the Toulon's phase sift circuit of when the phase of the voltage $V_N$ generated by the pulse transformer in the Toulon's phase sift circuit is delaying.
FIG. 18(b) is a graph illustrating the timings of generating a trigger in the relationship of FIG. 18(a)
Figure 18:
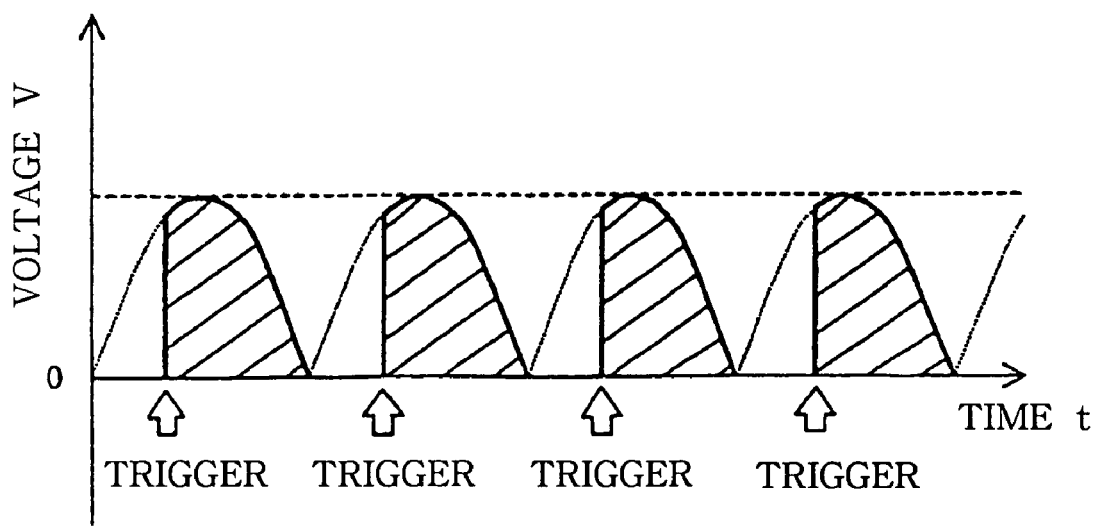

If the absolute value of the vector $V_R$ becomes smaller than the absolute value of the vector $V_C$ of the capacitor 19-16 due to the above change (FIG. 18(a)), a trigger is generated by the trigger forming circuit 19-1 at a moment slightly before the peak in the sinusoidal waveform of the power source voltage depending upon the phase of the vector $V_N$ of the pulse transformer 19-17 (since the vector $V_N$ is delayed behind the upper half (not shown) that starts with the middle point of the vector $V_S$ of the vertical bisector of the vector $V_S$) (see FIG. 18(b)).

When the trigger is generated, the SCR phase control unit 13-1 is operated, and the power source voltage from the voltage setting unit 12-1 is controlled for its phase.

Then, the applied voltage that is boosted and rectified assumes a waveform as shown in FIG. 18(b) and is applied to the magnetron 17-1 to start producing the microwaves.

Here, if FIG. 17(b) is compared with FIG. 18(b), the same electric power (same hatched areas of the waveforms) is supplied to the magnetron 17-1 when there is a feedback and the output is set to be constant, though the triggers are generated at different timings.

That is, even when the power source voltage is set to 200 [V] by the voltage setting unit 12-1 or is set to 180 [V], the electric power supplied to the magnetron 17-1 is the same.

In other words, upon adjusting and setting a maximum voltage value of the power source voltage through the voltage setting unit 12-1 and the voltage adjusting circuit 12 in addition to varying the output setpoint, the magnetron 17-1 can be supplied with the application voltage having a high maximum voltage and a short ON time (waveform shown in FIG. 17(b)) or, conversely, can be supplied with an application voltage having a low maximum voltage and a long ON time (waveform shown in FIG. 18(b)).

Namely, in the low output region, the output is set to be low and the power source voltage is increased by the voltage setting unit 12-1 to obtain an applied pulse voltage having a short ON time and a high peak output. In the high output region, the output is set to be high and the power source voltage is decreased by the voltage setting unit 12-1 to obtain an applied pulse voltage having a long ON time and a low peak output.

By utilizing the microwave output emitted from the thus adjusted magnetron 17-1, it is made possible to form a metal oxide film having good gas-barrier property via an organic layer having good adhesiveness.

As described above, by simply adjusting the voltage setting unit, the microwave power source device illustrated in FIG. 9 is capable of maintaining constant the electric power supplied to the magnetron, as will as producing an applied voltage having a high maximum voltage value and a short ON time and an applied voltage having a large average output and a long ON time. Upon adjusting both the voltage setting unit and the output setting unit, it is possible to adjust the voltage applied to the magnetron to obtain any desired waveform.

Second Embodiment

Next, a second embodiment of the microwave power source device of the present invention will be described with reference to FIG. 19.

Figure 19:
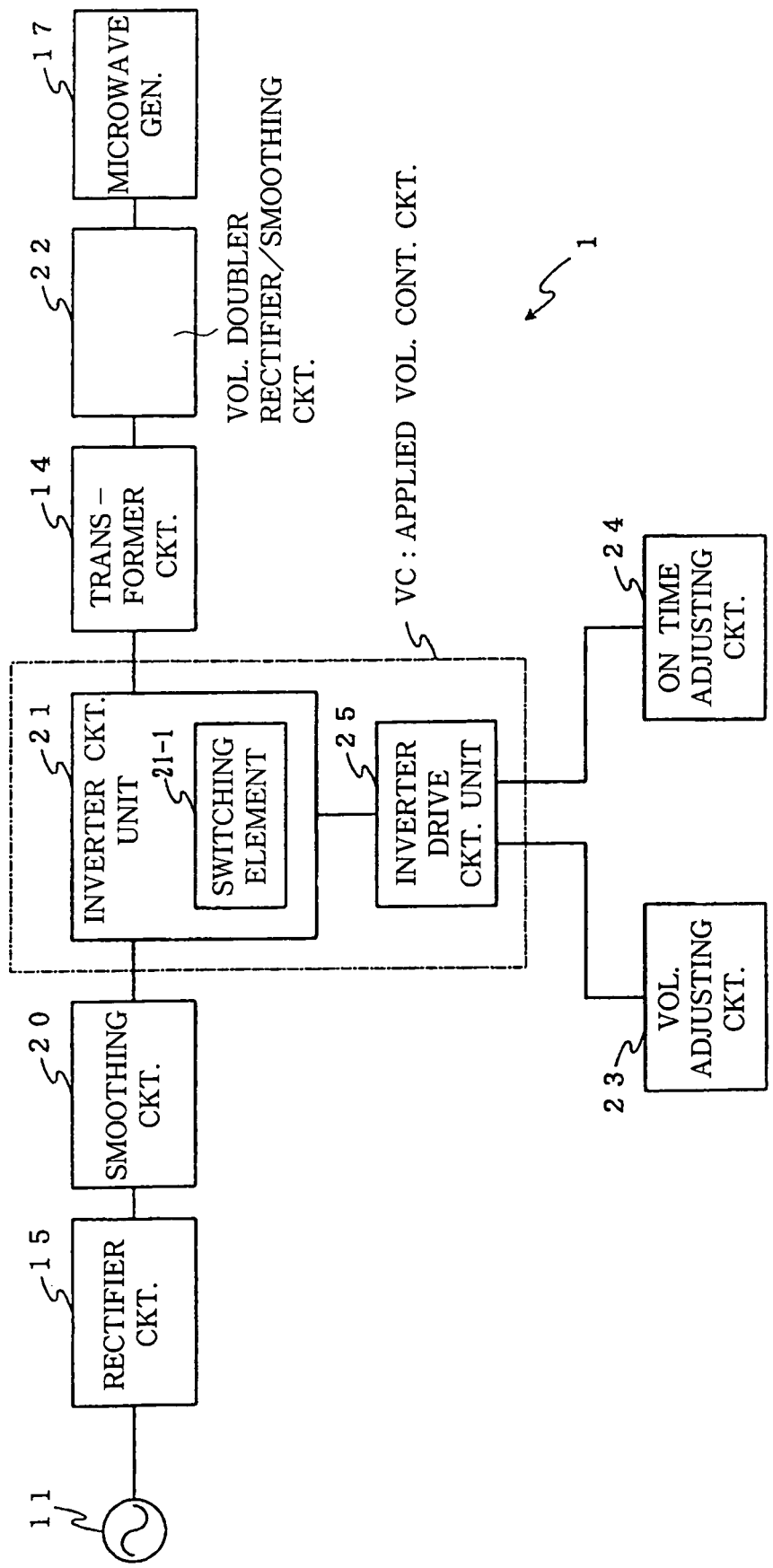
FIG. 19 is a block diagram illustrating the constitution of the microwave power source device according to a second embodiment of the present invention.

FIG. 19 is a block diagram illustrating the constitution of the microwave power source device according to this embodiment.

As compared to the power source device shown in FIG. 9, the microwave power source device 1 shown in FIG. 19 is based on a different applied voltage conversion system. Namely, in the microwave power source device shown in FIG. 9, the applied voltage conversion system is an iron transformer system whereas in the microwave power source device 1 shown in FIG. 19, the conversion system is an inverter system.

Concerning other constituent elements, FIG. 19 is the same as FIG. 9.

In FIG. 19, therefore, the same constituent portions as those of FIG. 9 are denoted by the same reference numerals but their detailed description is omitted.

Referring to FIG. 19, the microwave power source device 1 includes an AC power source 11, a rectifier circuit 15, a smoothing circuit 20, an inverter circuit unit 21, a transformer circuit 14, a voltage doubler rectifier/smoothing circuit 22, a microwave generator unit 17, a voltage adjusting circuit 23, an ON time adjusting circuit 24 and an inverter drive circuit unit 25.

In this embodiment, the inverter circuit unit 21 and an inverter drive circuit unit 25 in combination are referred to as "applied voltage control circuit VC".

Here, the rectifier circuit 15 full-wave-rectifies the power source voltage from the AC power source 11.

The smoothing circuit 20 is constituted by a capacitor, a resistor and a choke coil, and removes ripple components in the voltage rectified through the rectifier circuit 15.

The inverter circuit unit 21 has a switching element 21-1, and generates a high-frequency voltage (usually, the inverter frequency is not lower than 20 kHz) obtained by intermittently controlling the voltage from the smoothing circuit 20 depending upon the adjusted waves of the applied voltage from the inverter drive circuit unit 25.

Figure 20:
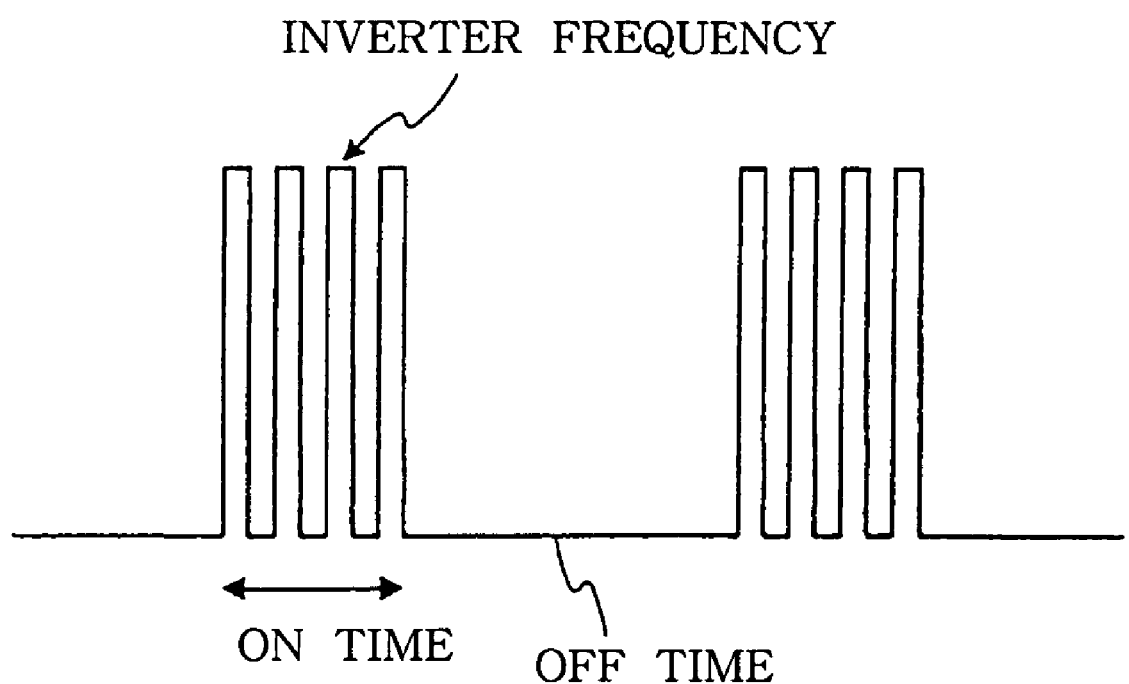
FIG. 20 is a diagram of waveforms of a high-frequency voltage intermittently controlled by an inverter circuit unit shown in FIG. 19.

FIG. 20 illustrates waveforms intermittently controlled by the inverter circuit unit 21.

As shown in FIG. 20, in the waveforms formed by the inverter circuit unit 21, the time in which the high-frequency voltage is generating is called "ON time" and the time in which the high-frequency voltage is not being generated is called "OFF time".

The high-frequency voltage is intermittently generated as pulses during the ON time.

The length of ON time of the high-frequency voltage intermittently generated by the inverter circuit unit 21, the length of OFF time, and the frequency of the high-frequency voltage during the ON time, are controlled by the inverter drive circuit 25.

The transformer circuit 14 is constituted by a booster transformer and the like, and boosts the high-frequency voltage from the inverter circuit unit 21.

A high-voltage winding and a winding for heating the cathode may be provided on the secondary side of the transformer circuit 14 (neither the high-voltage winding nor the winding for heating the cathode is shown).

The voltage doubler rectifier/smoothing circuit 22 includes a high-voltage capacitor and a high-voltage diode.

Among them, the high-voltage capacitor is electrically charged with a reverse high voltage appearing on the secondary high-voltage winding of the transformer circuit 14 during the OFF time of the switching element 21-1 in the inverter circuit unit 21.

The voltage with which the high-voltage capacitor is charged is serially added to a high voltage appearing on the secondary high-voltage winding of the transformer circuit 14 during the ON time of the switching element 21-1, and is applied to the anode of the microwave generating unit (e.g., magnetron, etc.).

The voltage adjusting circuit 23 receives a setpoint value (peak voltage value) of the applied voltage from an external unit. The voltage adjusting circuit 23 further receives, from the voltage doubler rectifier/smoothing circuit 22, the voltage applied to the microwave generator unit 17. That is, the voltage adjusting circuit 23 determines the peak voltage input from the external unit (or the peak voltage in the applied voltage from the voltage doubler rectifier/smoothing circuit 22) as a peak voltage of the applied voltage.

The ON time adjusting circuit 24 receives the ON time of the applied voltage from an external unit. Namely, the ON time adjusting circuit 24 determines the ON time input from the external unit as the ON time of the applied voltage.

The inverter drive circuit unit 25 forms a signal (applied voltage adjusting signal) for adjusting the waveform of the applied voltage based on the voltage setpoint value of the applied voltage received by the voltage adjusting circuit 23 and on the ON time of the applied voltage received by the ON time adjusting circuit 24, and controls the switching element 21-1 in the inverter circuit unit 21 depending upon the applied voltage adjusting signal.

With the microwave power source device being thus constituted, the output intensity of the microwaves emitted from the microwave generator unit can be varied depending upon the voltage setpoint value (peak voltage) of the applied voltage set by the voltage adjusting circuit and on the ON time of applied voltage set by the ON time adjusting circuit.

Upon setting the peak voltage of the applied voltage and ON time to suitable values, therefore, the microwaves can be output to the microwave generator unit as pulse waves of waveforms corresponding to the regions (low output region, high output region) in the step of forming the film.

Next, the circuit constitution of the microwave power source device 1 of FIG. 19 will be concretely described with reference to FIG. 21.

Figure 21:
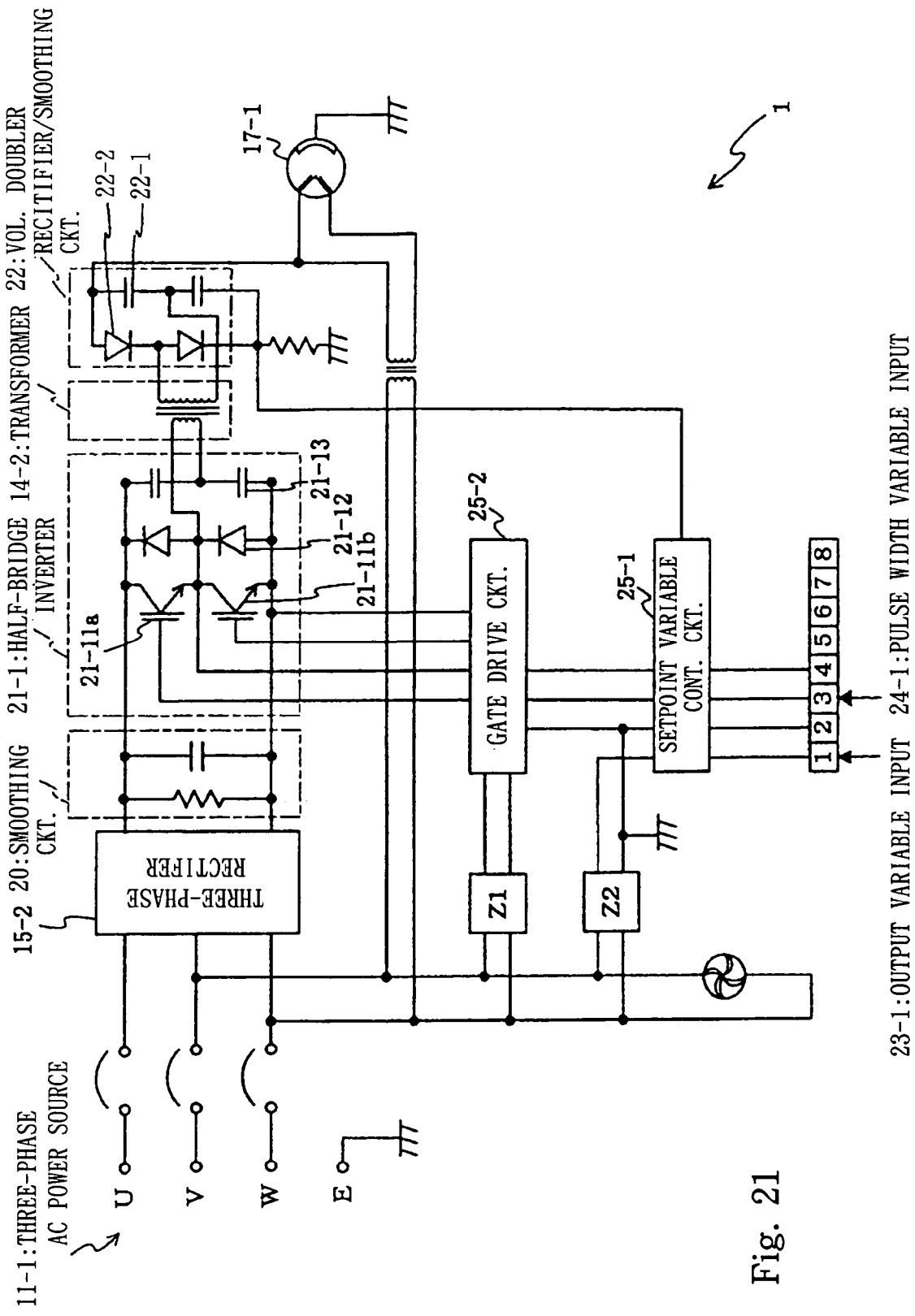
FIG. 21 is a diagram of an electric circuit concretely illustrating the circuit constitution of the microwave power source device shown in FIG. 19.

Referring to FIG. 21, the microwave power source device 1 includes a three-phase AC power source 11-1, a three-phase rectifier 15-2, a smoothing circuit 20, a half-bridge inverter 21-1, a transformer 14-2, a voltage doubler rectifier/smoothing circuit 22, a magnetron 17-1, an output variable input 23-1, a pulse width variable input 24-1, a setpoint variable control circuit 25-1, and a gate drive circuit 25-2.

The three-phase rectifier 15-2 converts the three-phase AC voltage from the three-phase AC power source 11-1 into a DC voltage.

Though FIG. 21 uses the three-phase AC power source 11-1 as the power source, there may be employed, for example, a two-phase AC power source not being necessarily limited to the three-phase AC power source.

The half-bridge inverter 21-1 includes a transistor 21-11 (e.g., insulated gate bipolar transistor (IGBT), bipolar junction transistor (BJT), MOS electric-field transistor (MOSFET), etc.) as a switching element, a diode 21-12, and a capacitor 21-13.

The transistor 21-11 has a gate that is connected to the gate drive circuit 25-2. Upon controlling the gate drive circuit 25-2, the DC voltage from the smoothing circuit 20 is converted into an intermittent high-frequency voltage (FIG. 20). The converted intermittent high-frequency voltage is applied to the primary winding of the transformer 14-2.

This embodiment is provided with two transistors 21-11 (transistor 21-11a and transistor 21-11b).

The transformer (inverter transformer) 14-2 boosts the high-frequency voltage from the half-bridge inverter 21-1, and applies it as a high-frequency high voltage to the voltage doubler rectifier/smoothing circuit 22.

The voltage doubler rectifier/smoothing circuit 22 includes a high-voltage capacitor 22-1 and a high-voltage diode 22-2, and the high-voltage capacitor 22-1 is electrically charged with a reverse high voltage appearing on the secondary high-voltage winding of the transformer 14-2 during the OFF time of the switching element in the inverter circuit 21. The voltage with which the high-voltage capacitor 22-1 is electrically charged is serially added to a high voltage appearing on the secondary high-voltage winding during the ON time of the switching element, and is applied to the anode of the magnetron 17-1.

The output variable input 23-1 is a variable unit (e.g., variable resistor, external control signal, etc.) provided for adjusting the peak voltage value (voltage setpoint value) of the voltage applied to the magnetron 17-1, and sends a signal (output control signal) representing the adjusted peak voltage to the setpoint variable control circuit 25-1.

The pulse width variable input 24-1 is a variable unit (e.g., variable resistor, external control signal, etc.) provided for adjusting the pulse width (ON time) of the voltage applied to the magnetron 17-1, and sends a signal (oscillation time control signal) representing the adjusted pulse width to the setpoint variable control circuit 25-1.

The setpoint variable control circuit (setpoint variable control unit) 25-1 receives a voltage setpoint value from the output variable input 23-1 and an ON time setpoint value from the pulse width variable input 24-1, and sends them to the gate drive circuit 25-2.

Figure 22:
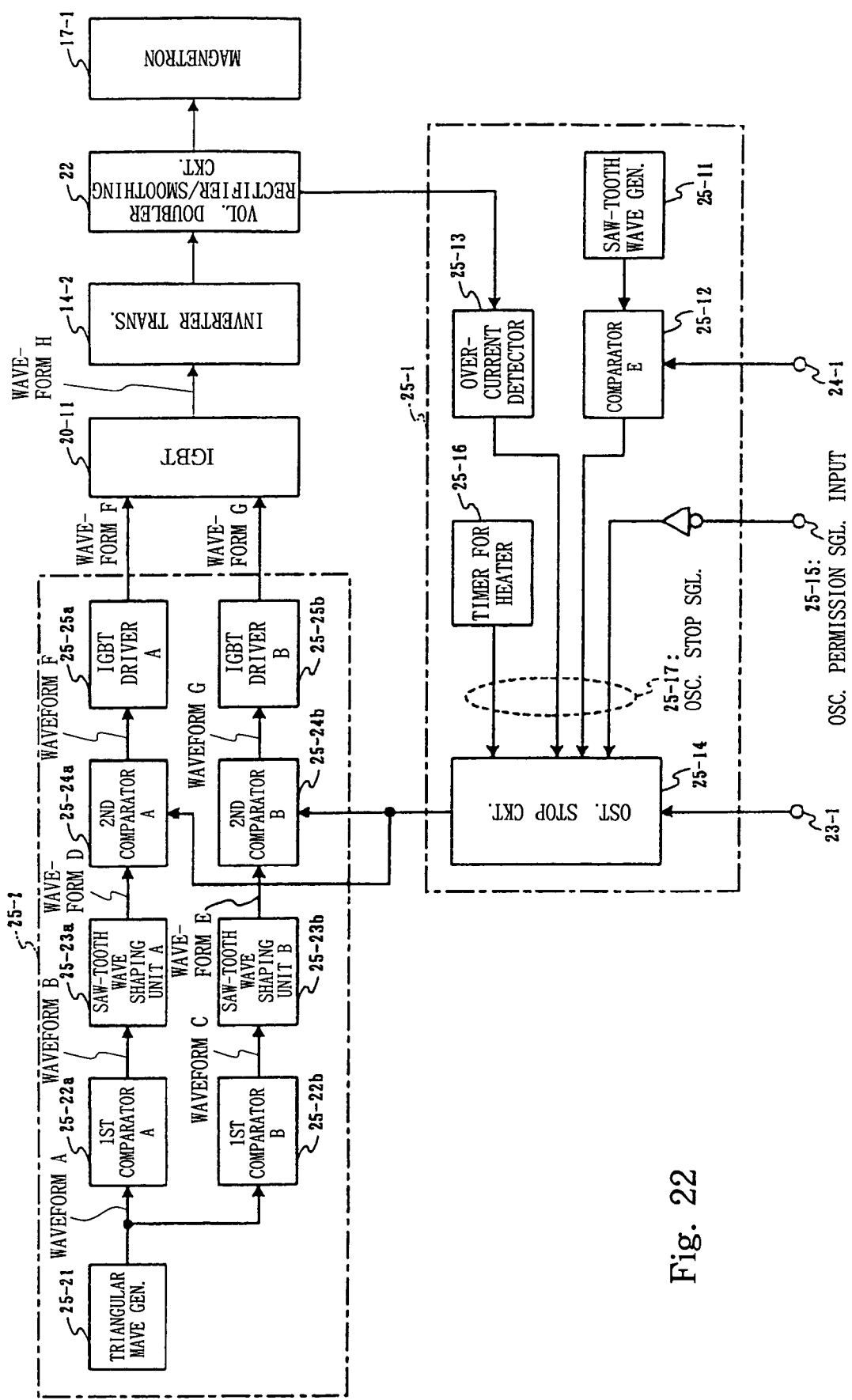
FIG. 22 is a block diagram concretely illustrating the constitutions of a setpoint variable control circuit and a gate drive circuit shown in FIG. 21.

Concretely speaking, the setpoint variable control circuit 25-1 includes, as shown in FIG. 22, a saw-tooth wave generator 25-11, a comparator E 25-12, an overcurrent detector 25-13, an oscillation stop circuit 25-14, an oscillation permission signal input 25-15, and a timer 25-16 for heater.

The saw-tooth wave generator 25-11 generates a saw-tooth wave at a predetermined cycle time.

The comparator E 25-12 puts the saw-tooth wave input from the saw-tooth wave generator 25-11 to the PWM (pulse width modulation) based on the pulse width adjustment value (oscillation time control signal) input from the pulse width variable input 24-1, and sends the waveform (oscillation stop signal) to the oscillation stop circuit 25-14.

The overcurrent detector 25-13 receives the voltage (applied voltage) applied to the magnetron 17-1 from the voltage doubler rectifier/smoothing circuit 22, judges whether the applied voltage that is received is an overcurrent, and sends the result of judgement (overcurrent detection signal) to the oscillation stop circuit 25-14.

The oscillation stop circuit 25-14 sends the output control signal input from the output variable input 23-1 to the second comparator A 25-24a and to the second comparator B 25-24b.

When the oscillation stop signal from the comparator E 25-12 indicates "0", the oscillation stop circuit 25-14 forcibly sets the output control signal to 0 [V].

The oscillation stop signal 25-17 includes a saw-tooth wave subjected to the PWM input from the comparator E 25-12, as well as an overcurrent detection signal input from the overcurrent detector 25-13, an oscillation permission signal input from the oscillation permission signal input 25-15, and a signal input from the timer 25-16 for heater.

The gate drive circuit (switching element drive unit) 25-2 drives the transistor (IGBT) 21-11 of the half-bridge inverter 21-1 based on the output control signal from the setpoint variable control circuit 25-1. When no output control signal is sent from the setpoint variable control circuit 25-1, the gate drive circuit 25-2 does not drive the transistor (IGBT) 21-11.

In this embodiment, the setpoint variable control circuit 25-1 and the gate drive circuit 25-2 in combination are referred to as "inverter drive circuit unit 25".

Here, as concretely illustrated in FIG. 22, the gate drive circuit 25-2 includes a triangular wave generator 25-21, a first comparator A 25-22a, a first comparator B 25-22b, a saw-tooth wave shaping unit A 25-23a, a saw-tooth wave shaping unit B 25-23b, a second comparator A 25-24a, a second comparator B 25-24b, an IGBT driver A 25-25a and an IGBT driver B 25-25b.

Figure 23:
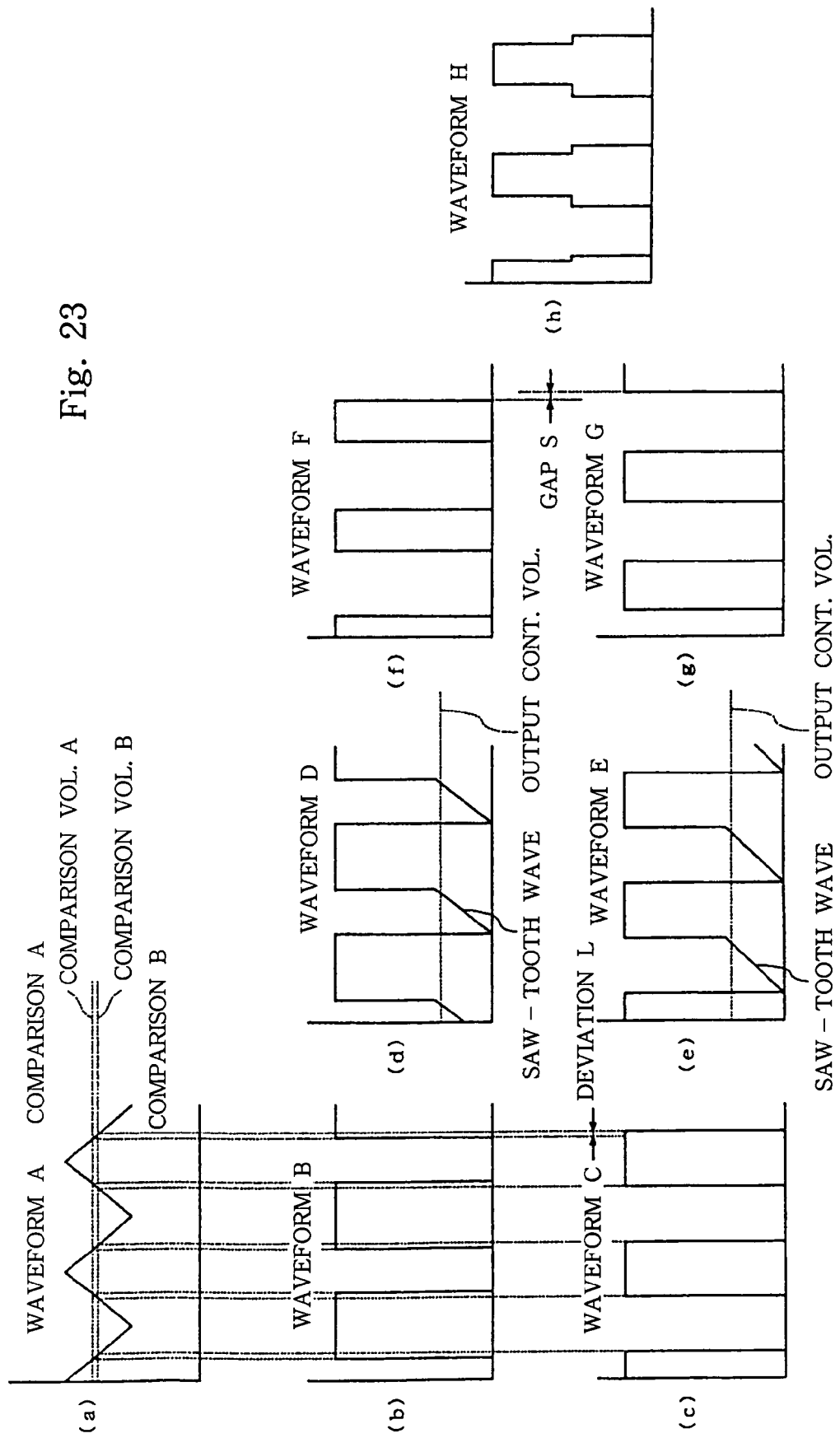
FIG. 23 is a diagram of waveforms output from various constituent portions in the gate drive circuit shown in FIG. 22.

The triangular wave generator 25-21 generates a triangular wave (waveform A)(FIG. 23(a)).

The first comparator A 25-22a compares the triangular wave generated by the triangular wave generator 25-21 with a predetermined threshold value (comparison voltage A)(comparison A) and generates a square wave (waveform B) when the triangular wave has a value smaller than the threshold value.

The first comparator B 25-22b compares the triangular wave generated by the triangular wave generator 25-21 with a threshold value (comparison voltage B set to a value lower than the comparison voltage A)(comparison B) and generates a square wave (waveform C) when the triangular wave has a value larger than the threshold value (FIG. 23(c)).

The saw-tooth wave shaping unit A 25-23a shapes the saw-tooth wave and adds it to the square wave generated by the first comparator A 25-22a (waveform D, FIG. 23(d)).

The saw-tooth wave shaping unit B 25-23b shapes the saw-tooth wave and adds it to the square wave generated by the first comparator B 25-22b (waveform E, FIG. 23(e)).

The second comparator A 25-24a compares the square wave (waveform D) obtained by shaping the saw-tooth wave through the saw-tooth wave shaping unit A 25-23a with the voltage value of the output control signal (output control voltage) input from the oscillation stop circuit 25-14, and generates a square wave (waveform F)(FIG. 23(f)) when the waveform D has a value smaller than the output control voltage.

The second comparator B 25-24b compares the square wave (waveform E) obtained by shaping the saw-tooth wave through the saw-tooth wave shaping unit B 25-23b with the voltage value of the output control signal (output control voltage) input from the oscillation stop circuit 25-14, and generates a square wave (waveform G)(FIG. 23(g)) when the waveform E has a value smaller than the output control voltage.

The IGBT driver A 25-25a drives the transistor (IGBT) 21-11a in the half-bridge inverter 21-1 depending upon the square wave (waveform F) from the second comparator A 25-24a.

The IGBT driver B 25-25b drives the transistor (IGBT) 21-11b in the half-bridge inverter 21-1 depending upon the square wave (waveform G) from the second comparator B 25-24b.

FIG. 23(h) illustrates a voltage given to the inverter transformer 14-2 by driving the transistor (IGBT) 21-11a and the transistor (IGBT) 21-11b.

The comparison voltage A of the first comparator A 25-22a is set to a value slightly higher than the comparison voltage B of the first comparator B 25-22b. Therefore, the "deviation L" occurs when the waveform B rises and when the waveform C breaks (or when the waveform B breaks and when the waveform C rises). Due to the occurrence of "deviation L", a "gap S" is formed between the waveform F output from the second comparator A 25-24a and the waveform G output from the second comparator B 25-24b.

Namely, the waveform F for operating the IGBT driver A 25-25a is formed at a timing different from the timing of forming the waveform G for operating the IGBT driver B 25-25b, and the "gap S" exists between the waveform F and the waveform G. Therefore, the IGBT 21-11a and the IGBT 21-11b in the half-bridge inverter 20-1 are never turned on simultaneously.

Further, the waveforms shown in FIGS. 23(a) to 23(h) are controlled when the output control signals are sent from the oscillation stop circuit 25-14 in the setpoint variable control circuit 25-1 to the second comparator A 25-24a and to the second comparator B 25-24b.

When no output control signal is sent from the oscillation stop circuit 25-14 to the second comparator A 25-24a or to the second comparator B 25-24b (when "0" is indicated by the oscillation stop signal 25-27 sent to the oscillation stop circuit 25-14 from the comparator E 24-12 in the setpoint variable control circuit 25-1), the waveform F sent from the second comparator A 25-24a to the IGBT driver A 25-25a becomes 0 [V] and, besides, the waveform G sent from the second comparator B 25-24b to the IGBT driver B 25-25b becomes 0 [V]. Accordingly, no waveform is output from the IGBT 20-11, and no microwave is generated from the magnetron 17-1.

By sending the output control signal from the oscillation stop circuit 25-14 to the second comparator A 25-24a and to the second comparator B 25-24b as described above, the peak voltage in the applied voltage can be adjusted. Further, by providing a time (ON time) for transmitting the output control signal and a time (OFF time) for not transmitting the output control signal, the microwaves can be intermittently generated.

Namely, the peak voltage of the applied voltage output from the IGBT 20-11 is adjusted relying upon the voltage setpoint value input by the output variable input 23-1. Further, the ON time for the applied voltage output from the IGBT 20-11 is adjusted relying upon the pulse width setpoint value input by the pulse width variable input 24-1.

Figure 24:
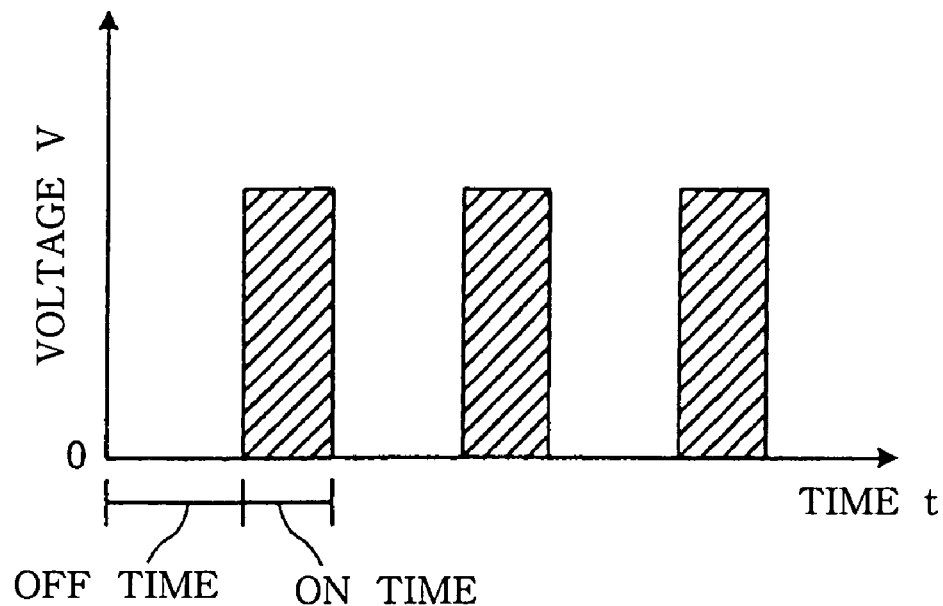
FIG. 24 is a diagram of waveforms of an applied voltage of when the ON time is set to be short by the pulse width variation input.
Figure 25:
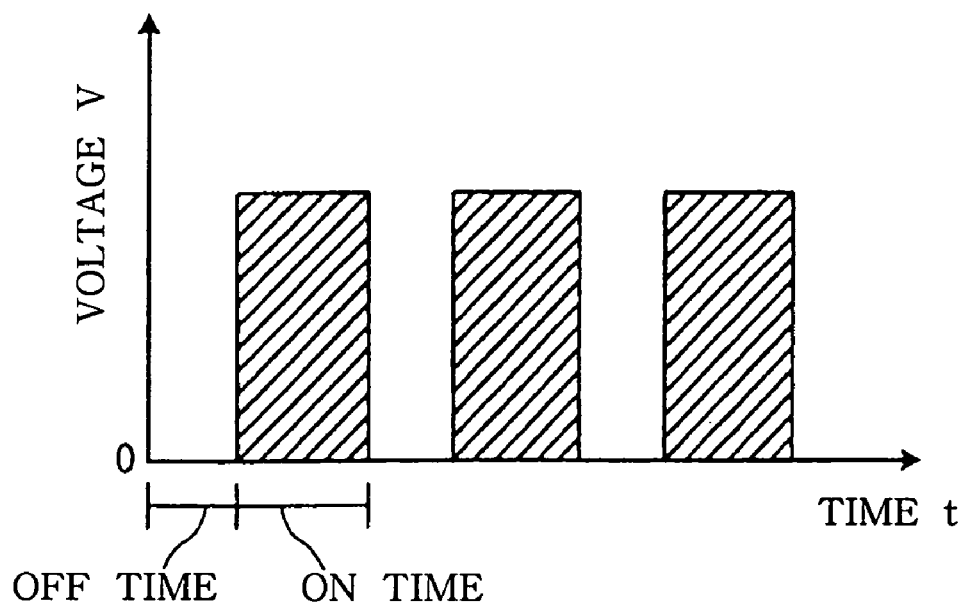
FIG. 25 is a diagram of waveforms of an applied voltage of when the ON time is set to be long by the pulse width variation input.

Among the above waveforms, FIGS. 24 and 25 illustrate the formation of waveform of the applied voltage at the time of adjusting the ON time of the applied voltage relying upon the pulse width setpoint value input by the pulse width variable input 24-1.

When, for example, the ON time is set to be short by the pulse width variable input 24-1, the OFF time becomes long and the ON time becomes short as shown in FIG. 24.

When the ON time is set to be long by the pulse width variable input 24-1, on the other hand, the OFF time becomes short and the ON time becomes long as shown in FIG. 25. In these two cases, the height of voltage varies accompanying the changes in the output variable input.

In the pulse wave of FIG. 24 or 25, a high frequency is output from the transistor 21-11 in the half-bridge inverter 21-1. Therefore, the waveform shown in FIG. 24 or 25 represents the intermittent output of pulse waves formed at a high frequency.

Therefore, the DC voltage sent to the half-bridge inverter 21-1 from the smoothing circuit 20 is converted, due to the on/off control of the transistor 21-11, into waveforms of a high frequency depending upon the voltage setpoint value input by the output variable input 23-1, the pulse width (ON time) input by the pulse width variable input 24-1, and the value of the applied voltage input by the gate drive circuit (output/pulse width control circuit) 25-2.

According to the microwave power source device shown in FIG. 9 or 19 as described above, the waveform of the applied voltage is formed based on both the voltage setpoint value set by the voltage adjusting circuit and the ON time set by the ON time adjusting circuit. Therefore, the output of microwaves emitted from the microwave generator is controlled by adjusting either one or both of the voltage setpoint value or the ON time. In the initial step of forming the film (low output region), therefore, the ON time is shortened while increasing the voltage setpoint value and, then, in the subsequent high output step (high output region), the ON time is lengthened while increasing the voltage setpoint value, thereby to form a thin film having good properties (barrier property and adhesiveness).

Further, since the ON time of the applied voltage can be shortened while increasing the output of the microwaves, it is allowed to increase the plasma light emission in the process chamber.

Accompanying a reduction in the ON time in the initial step, further, the high output time is also shortened in the step of high output, making it possible to shorten the time required for wholly forming the thin film by the plasma CVD.

EXAMPLES

In the following Examples, the gas-barrier property of the silicon oxide film formed on the inner surface of the PET bottle, adhesiveness thereof, and thickness of the organic layer in the film, were evaluated and measured as described below.

1. Gas-barrier Property.

A PET bottle having a silicon oxide film formed on the inner surface thereof was measured for its amount of oxygen permeation at 37° C., 100% RH by using an oxygen permeation measuring apparatus (OX-TRAN, manufactured by Modern Control Co.), and a value relative to the oxygen permeation amount of the PET bottle without the silicon oxide film was indicated as gas-barrier property. The smaller this value, the more improved the gas-barrier property.

2. Adhesiveness (Water Resistance).

A PET bottle having a silicon oxide film formed on the inner surface thereof was filled with oxygen-free water. After a cap was attached, the PET bottle was preserved in an environment of the air at 37° C. After three weeks have passed, water in the bottle was measured for its oxygen concentration. A value relative to the oxygen concentration in the PET bottle without silicon oxide film was indicated as water resistance. The smaller this value, the more improved the gas-barrier property and the more excellent the water resistance and adhesiveness.

3. Thickness of the Organic Layer.

The inner surface of the barrel portion of the PET bottle having the silicon oxide film formed on the inner surface was measured for the distribution of silicon, oxygen and carbon in the direction of depth of the film by an X-ray photoelectron spectroscopic apparatus (Quantum 2000) manufactured by PHI Co., and the thickness of the region where the carbon concentration was not lower than 15% and the silicon concentration was not lower than 10% was indicated as the thickness of the organic layer.

Example 1

A silicon oxide film was formed on the inner surface of a PET bottle having a content of 520 ml by using a plasma treatment apparatus equipped with the microwave power source device shown in FIG. 9 and with the plasma treatment chamber of the structure shown in FIG. 8, by using a hexamethyldisiloxane (HMDSO) and oxygen as treatment gases and by introducing the microwaves into the plasma treatment chamber under the following conditions.

Low output region (t1 to t3): 2 seconds
   Introduction period (t1): 0.5 seconds
   Microwave output E1: 50 watts
   Max. output (peak output): 200 watts
   Microwave oscillation time (ON time):
     0.9 milliseconds/one period
Shifting period (t3 to t4): 3 seconds
High output region (t4 to t5): 3 seconds
   Microwave output E2: 480 watts
   Max. output (peak output): 1500 watts
   Microwave oscillation time (ON time):
     3.8 milliseconds/one period The PET bottle having the film evaporated on the inner surface thereof was measured for its gas-barrier property, adhesiveness, thickness of the organic layer and the total film thickness. The results were as shown in Table 1.

Example 2

A silicon oxide film was formed on the inner surface of the PET bottle in quite the same manner as in Example 1 but using the plasma treatment apparatus equipped with the microwave power source device shown in FIG. 19 and by introducing the microwaves into the plasma treatment chamber under the following conditions, and was evaluated in the same manner as in Example 1. The results were as shown in Table 1.

Low output region (t1 to t3): 3 seconds
   Introduction period (t1): 0.1 seconds
   Microwave output E1: 30 watts
   Max. output (peak output): 800 watts
   Microwave oscillation time (ON time):
     0.3 milliseconds/one period Shifting period (t3 to t4): 2 seconds
High output region (t4 to t5): 3 seconds
  Microwave output E2: 480 watts
  Max. output (peak output): 1000 watts
  Microwave oscillation time (ON time):
    5.5 milliseconds/one period Example 3

A silicon oxide film was formed on the inner surface of the PET bottle in quite the same manner as in Example 1 but using the plasma treatment apparatus equipped with a known microwave power source device and by introducing the microwaves (GHz) into the plasma treatment chamber under the following conditions, and was evaluated in the same manner as in Example 1. The results were as shown in Table 1.
  Low output region (t1 to t3): 2 seconds
    Introduction period (t1): 0.5 seconds
    Microwave output E1: 50 watts
  Shifting period (t3 to t4): 3 seconds
  High output region (t4 to t5): 3 seconds
    Microwave output E2: 480 watts Comparative Example 1

A silicon oxide film was formed on the inner surface of the PET bottle in quite the same manner as in Example 1 with the exception of using the plasma treatment apparatus used in Example 3, without providing the low output region, and introducing the microwaves (2.45 GHz) into the plasma treatment chamber through one step of high output region, and was evaluated in the same manner as in Example 1. The results were as shown in Table 1. The times for introducing the microwaves were set as follows:
  High output region: 3 seconds (without low output region)
    Introduction period: 3 seconds
    Microwave output: 480 watts

TABLE 1

|  | Ex. 1 | Ex. 2 | Ex. 3 | Comp. Ex. 1 |
| --- | --- | --- | --- | --- |
| Total thickness | 13 nm | 18 nm | 15 nm | 13 nm |
| Thickness of organic layer | 2.5 nm | 3 nm | 2 nm | 0 nm |
| Gas barrier property | 1/20 | 1/150 | 1/10 | 1/5 |
| Adhesiveness (water resistance) | 1/5.2 | 1/7 | 1/4 | 1/1.3 |

The invention claimed is:

1. A method of forming a metal oxide film in a plasma treatment chamber having a gas-barrier property on a surface of a predetermined substrate by plasma CVD using a treatment gas which contains a gas of an organometal and an oxidizing gas, said method comprising:
  executing a low power glow discharge so as to carry out a reaction chiefly between the organometal contained in the treatment gas and thereby form a first CVD film on the surface of the substrate, and
  executing a high power glow discharge so as to react the organometal with the oxidizing gas and thereby form a second CVD film on the first CVD film, wherein:
    (a) the low power glow discharge and the high power glow discharge are executed in the same plasma treatment chamber;
    (b) the same organometal is employed for the low power glow discharge and the high power glow discharge; and
    (c) the low power glow discharge and the high power glow discharge are executed at the same frequency, wherein said glow discharge is carried out in a microwave electric field,
  said low power is in a range of 20 to 90 watts,
  said high power is in a range of not lower than 100 watts, and
  an output power of said microwave electric field is continuously changed from said low power up to said high power.

2. A method of forming a metal oxide film according to claim 1, wherein an output of said microwave electric field is changed from said low power to said high power, which is, then, followed by the repetition of a change of output from high power to low power and a change of output from low power to high power.

3. A method of forming a metal oxide film according to claim 1, wherein said organometal comprises an organosilicon compound.

4. A method of forming a metal oxide film according to claim 3, wherein said first CVD film comprises an organic layer having a thickness of not larger than 10 nm formed on the surface of the substrate by a low power microwave glow discharge, said organic layer being rich in carbon and having a carbon concentration of not smaller than 15% on the basis of three elements of O, C and Si.

5. A method of forming a metal oxide film according to claim 4, wherein said metal oxide film has a total thickness of not larger than 100 nm.

6. A method of forming a metal oxide film according to claim 1, wherein said substrate comprises a plastic material.

7. A method of forming a metal oxide film according to claim 1, wherein microwaves in said microwave electric field are intermittently oscillated.

8. A method of forming a metal oxide film according to claim 7, wherein an output waveform of said microwaves is changed by changing a maximum output and an oscillation time.

9. A method of forming a metal oxide film according to claim 7, wherein an output waveform of the microwaves in the low power glow discharge is different from an output waveform of the microwaves in the high power glow discharge.

10. A method of forming a metal oxide film according to claim 9, wherein an output waveform of the microwaves in the low power glow discharge is such that an oscillation time of microwaves in one period is not longer than 1.5 milliseconds.

11. A method of forming a metal oxide film according to claim 9, wherein an output waveform of the microwaves in the high power glow discharge is such that an oscillation time of microwaves in one period is not shorter than 2 milliseconds.

12. A method of forming a metal oxide film according to claim 7, wherein a stop time of the microwaves in one period is 2 milliseconds to 30 milliseconds.

* * * * *